(12) United States Patent
Kawaguchi et al.

(10) Patent No.: US 10,234,959 B2
(45) Date of Patent: Mar. 19, 2019

(54) INPUT APPARATUS, KEYBOARD, AND ELECTRONIC APPARATUS

(71) Applicant: SONY CORPORATION, Tokyo (JP)

(72) Inventors: Hiroto Kawaguchi, Kanagawa (JP); Tomoko Katsuhara, Kanagawa (JP); Akira Ebisui, Kanagawa (JP); Taizo Nishimura, Kanagawa (JP); Hiroshi Mizuno, Kanagawa (JP); Yoshiaki Sakakura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/524,733

(22) PCT Filed: Nov. 4, 2015

(86) PCT No.: PCT/JP2015/005531
§ 371 (c)(1),
(2) Date: May 5, 2017

(87) PCT Pub. No.: WO2016/075901
PCT Pub. Date: May 19, 2016

(65) Prior Publication Data
US 2017/0351339 A1 Dec. 7, 2017

(30) Foreign Application Priority Data
Nov. 14, 2014 (JP) .................. 2014-232112

(51) Int. Cl.
*G06F 3/02* (2006.01)
*G06F 3/041* (2006.01)
(Continued)

(52) U.S. Cl.
CPC ............... *G06F 3/02* (2013.01); *G06F 3/016* (2013.01); *G06F 3/0202* (2013.01);
(Continued)

(58) Field of Classification Search
CPC .......... G06F 3/016; G06F 3/02; G06F 3/0202; G06F 3/03547; G06F 3/041;
(Continued)

(56) References Cited

U.S. PATENT DOCUMENTS 8,912,458 B2 * 12/2014 Peterson ............... G06F 3/0202
200/344
9,941,878 B2 * 4/2018 Bolender ........... H03K 17/9622
(Continued)

FOREIGN PATENT DOCUMENTS

| CN | 101276697 A | 10/2008 |
| CN | 101320644 A | 12/2008 |

(Continued)

OTHER PUBLICATIONS

International Search Report and Written Opinion of PCT Application No. PCT/JP2015/005531, dated Dec. 8, 2015, 11 pages of English Translation and 10 pages of ISRWO.

(Continued)

*Primary Examiner* — Tony O Davis
(74) *Attorney, Agent, or Firm* — Chip Law Group

(57) ABSTRACT

An input apparatus includes a conductive layer having flexibility, a capacitance-type sensor layer having a plurality of detection units, and a structure layer having a plurality of structures, a reaction force of which is non-linearly changed with respect to a pressing amount. The structure layer is disposed between the conductive layer and the sensor layer. The two or more structures are disposed in an operation area corresponding to the detection units.

17 Claims, 36 Drawing Sheets

(51) Int. Cl.
*G06F 3/044* (2006.01)
*G06F 3/01* (2006.01)
*H03K 17/96* (2006.01)
*H03K 17/98* (2006.01)
*G06F 3/0354* (2013.01)

(52) U.S. Cl.
CPC .......... *G06F 3/03547* (2013.01); *G06F 3/041* (2013.01); *G06F 3/044* (2013.01); *G06F 3/0414* (2013.01); *H03K 17/9622* (2013.01); *H03K 17/98* (2013.01); *H03K 2217/96077* (2013.01); *H03K 2217/960755* (2013.01)

(58) Field of Classification Search
CPC ... G06F 3/0414; G06F 3/044; H03K 17/9622; H03K 17/98; H03K 2217/960755; H03K 2217/96077
USPC .................................. 345/156, 158, 170–176
See application file for complete search history.

(56) References Cited

U.S. PATENT DOCUMENTS

| | | | | |
|---|---|---|---|---|
| 9,941,879 | B2* | 4/2018 | Lee | H03K 17/98 |
| 9,947,493 | B2* | 4/2018 | Moua | H01H 13/705 |
| 2008/0237011 | A1 | 10/2008 | Lee et al. | |
| 2008/0296140 | A1 | 12/2008 | Yoshihara et al. | |
| 2009/0248382 | A1 | 10/2009 | Ishikawa et al. | |
| 2011/0203912 | A1* | 8/2011 | Niu | H01H 3/125 200/341 |
| 2011/0296975 | A1* | 12/2011 | de Jong | G10H 1/0555 84/725 |
| 2011/0310459 | A1* | 12/2011 | Gates | G06F 3/0412 359/296 |
| 2012/0229401 | A1* | 9/2012 | Birnbaum | G06F 3/016 345/173 |
| 2014/0034468 | A1* | 2/2014 | Krumpelman | H01H 3/122 200/5 A |
| 2014/0034469 | A1* | 2/2014 | Krumpelman | H01H 13/85 200/5 A |
| 2014/0034470 | A1* | 2/2014 | Krumpelman | H01H 13/85 200/5 A |
| 2014/0034471 | A1* | 2/2014 | Krumpelman | H01H 13/85 200/5 A |
| 2014/0034472 | A1* | 2/2014 | Krumpelman | H01H 13/70 200/5 A |
| 2014/0190810 | A1* | 7/2014 | Krumpelman | G01R 27/2605 200/5 A |
| 2014/0191973 | A1* | 7/2014 | Zellers | G06F 3/0414 345/168 |
| 2014/0262717 | A1* | 9/2014 | Krumpelman | H01H 13/85 200/5 A |
| 2014/0266814 | A1* | 9/2014 | Hu | G06F 3/0202 341/26 |
| 2014/0311880 | A1* | 10/2014 | Krumpelman | H01H 13/14 200/5 A |
| 2014/0311881 | A1* | 10/2014 | Krumpelman | H01H 13/14 200/5 A |
| 2015/0193008 | A1* | 7/2015 | Bolender | G06F 3/0202 345/168 |
| 2015/0194277 | A1* | 7/2015 | Bokma | H03K 17/9622 200/5 A |
| 2015/0205368 | A1* | 7/2015 | Yairi | G06F 3/046 345/173 |
| 2015/0277504 | A1* | 10/2015 | Odell | G06F 3/0202 361/679.09 |
| 2015/0277620 | A1* | 10/2015 | Bulea | G06F 3/0202 345/168 |
| 2015/0280707 | A1* | 10/2015 | Hovden | H03K 17/9622 341/33 |
| 2016/0118203 | A1* | 4/2016 | Moua | H01H 13/705 307/115 |
| 2016/0118982 | A1* | 4/2016 | Lee | H03K 17/98 307/115 |
| 2017/0149433 | A1* | 5/2017 | Bolender | H03K 17/9622 |
| 2017/0322647 | A1* | 11/2017 | Katsuhara | G06F 3/02 |

FOREIGN PATENT DOCUMENTS

| | | |
|---|---|---|
| JP | 2005-166466 A | 6/2005 |
| JP | 2005-234704 A | 9/2005 |
| JP | 2009-016330 A | 1/2009 |
| JP | 2009-16330 A | 1/2009 |
| JP | 2009-245307 A | 10/2009 |
| JP | 2011-175981 A | 9/2011 |
| KR | 10-2008-0088324 A | 10/2008 |
| WO | 2014/162647 A1 | 10/2014 |

OTHER PUBLICATIONS

International Preliminary Report on Patentability of PCT Application No. PCT/JP2015/005531, dated May 26, 2017, 11 pages of English Translation and 06 pages of IPRP.

* cited by examiner

INPUT APPARATUS, KEYBOARD, AND ELECTRONIC APPARATUS

CROSS REFERENCE TO RELATED APPLICATIONS

This application is a U.S. National Phase of International Patent Application No. PCT/JP2015/005531 filed on Nov. 4, 2015, which claims priority benefit of Japanese Patent Application No. JP 2014-232112 filed in the Japan Patent Office on Nov. 14, 2014. Each of the above-referenced applications is hereby incorporated herein by reference in its entirety.

TECHNICAL FIELD

The present technology relates to an input apparatus, a keyboard, and an electronic apparatus. Specifically, the present technology relates to an input apparatus provided with an electrostatic capacitance-type sensor layer.

BACKGROUND ART

In recent years, for mobile PCs (Personal Computer) and tablet PCs, reductions in size and thickness are being demanded. For keyboards attached thereto, reductions in size and thickness are being demanded along with achieving lighter, more compact main bodies.

While touch panels on which displays are touched and operated are in the mainstream, moving hands between a display and a keyboard during an operation impairs usability. For this reason and the like, touchpads attached to keyboards are still being demanded. The areas of keyboards are increasingly reduced, and along with this, disposition of touchpad functions is more important.

For example, in Patent Literature 1, there has been proposed such an input apparatus that a different input means can be operated on the same operation surface.

CITATION LIST

Patent Literature

Patent Literature 1: Japanese Patent Application Laid-open No. 2005-166466

DISCLOSURE OF INVENTION

Technical Problem

The present technology has an object to provide an input apparatus, a keyboard, and an electronic apparatus which allow two kinds of input operations to be performed on the same operation screen, and can increase an area in which a reaction force nonlinearly changes with respect to a position pressed by an operator

Solution to Problem

To solve the problem described above, according to a first technology, there is provided an input apparatus, including:
 a conductive layer having flexibility;
 a capacitance-type sensor layer including a plurality of detection units; and
 a structure layer including a plurality of structures, a reaction force of which is non-linearly changed with respect to a pressing amount, the structure layer being disposed between the conductive layer and the sensor layer,
 in which two or more structures are arranged for an operation area corresponding to the detection units.

According to a second technology, there is provided an input apparatus, including:
 a capacitance-type sensor layer including a plurality of detection units; and
 a structure layer including a plurality of structures, a reaction force of which is non-linearly changed with respect to a pressing amount, the structure layer being disposed on the sensor layer, in which
 the structure layer has flexibility and conductivity, and
 two or more structures are arranged for an operation area corresponding to the detection units.

According to a third technology, there is provided a keyboard, including:
 a conductive layer having flexibility;
 a capacitance-type sensor layer having a plurality of detection units; and
 a structure layer having a plurality of structures, a reaction force of which is non-linearly changed with respect to a pressing amount, the structure layer being disposed between the conductive layer and the sensor layer, in which
 the two or more structures are disposed in an operation area corresponding to the detection units.

According to a fourth technology, there is provided an electronic apparatus, including:
 a conductive layer having flexibility;
 a capacitance-type sensor layer having a plurality of detection units; and
 a structure layer having a plurality of structures, a reaction force of which is non-linearly changed with respect to a pressing amount, the structure layer being disposed between the conductive layer and the sensor layer, in which
 the two or more structures are disposed in an operation area corresponding to the detection units.

Advantageous Effects of Invention

As described above, according to the present technology, it is possible to perform two kinds of input operations on the same operation screen and increase the area in which the reaction force nonlinearly changes with respect to the position pressed by the operator.

MODES FOR CARRYING OUT THE INVENTION

Embodiments of the present technology will be described with reference to the drawings in the following order. It should be noted that for each of the drawings of the embodiments below, the same or corresponding parts are denoted by the same symbols.

1. First embodiment (example of sensor module provided with structure layer with laminated structure and electronic apparatus provided with same)
   1.1 Outline
   1.2 Configuration of electronic apparatus
   1.3 Configuration of sensor module
   1.4 Operation of sensor module
   1.5 Change in reaction force and capacitance with respect to pressing of structure
   1.6 Operation of controller IC
   1.7 Effect
   1.8 Modified examples
2. Second embodiment (example of sensor module provided with structure layer with single layer structure)
   2.1 Outline
   2.2 Configuration of sensor module
   2.3 Operation of sensor module
   2.4 Effect
   2.5 Modified examples
3. Third embodiment
   3.1 Configuration of uneven film
   3.2 Effect
   3.3 Modified examples
4. Fourth embodiment
   4.1 Configuration of uneven structure
   4.2 Modified examples 1. First Embodiment

[1.1 Outline]

Figure 1A:
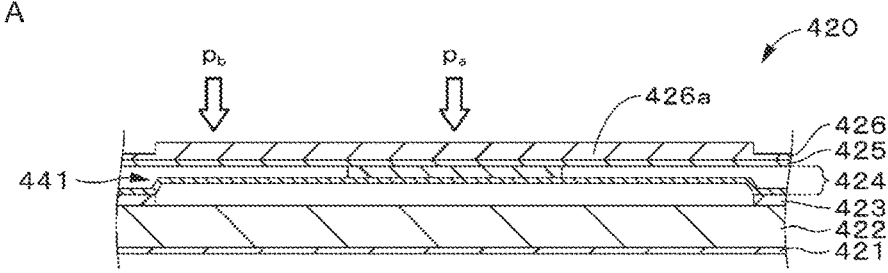
FIG. 1A is a cross-sectional view showing an example of a configuration of a sensor module.
Figure 1B:
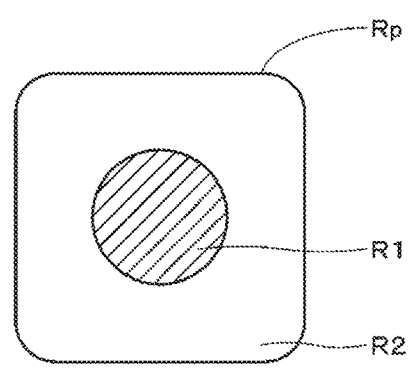
FIG. 1B is a schematic diagram showing an area where a sense of click is likely to be generated and an area where the sense of click is unlikely to be generated.
Figure 1C:
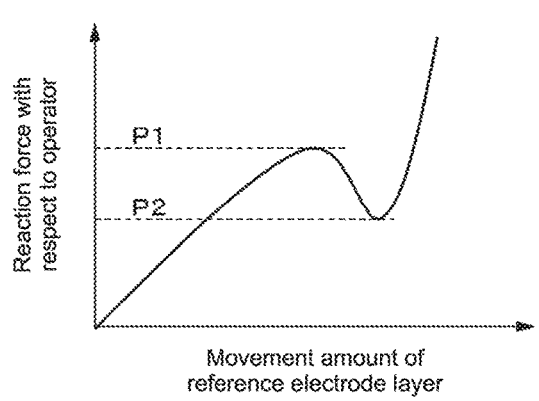
FIG. 1C is a graph showing a relationship between a movement amount of a reference electrode layer and a reaction force to an operator.

The inventors of the present technology study a sensor module having a configuration shown in FIG. 1A as a sensor module that allows two kinds of input operations to be performed on the same operation screen and can generate a sense of click with a thin structure. A sensor module 420 is provided with a reference electrode layer 421, a sensor layer 422, an intermediate layer 423, a structure layer 424 including a plurality of structures 441, a reference electrode layer 425, and a key top layer 426 including a plurality of keys 426a. As shown in FIG. 1C, the structure 441 has the following function. That is, a reaction force is increased in accordance with pressing by an operator up to P1 as a maximum. When a pressing amount is further increased, the reaction force is decreased to P2. When pressing the structure up to a limit point of pressing deformation, the reaction force is increased again.

Figure 2A:
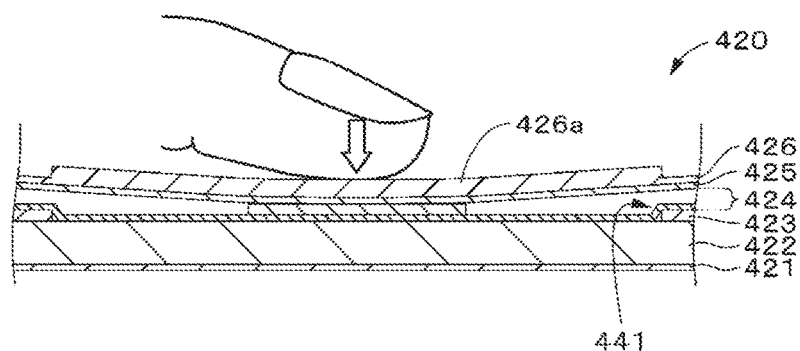
FIG. 2A is a cross-sectional view for explaining an example of an operation of the sensor module when the center of a key is pressed.
Figure 2B:
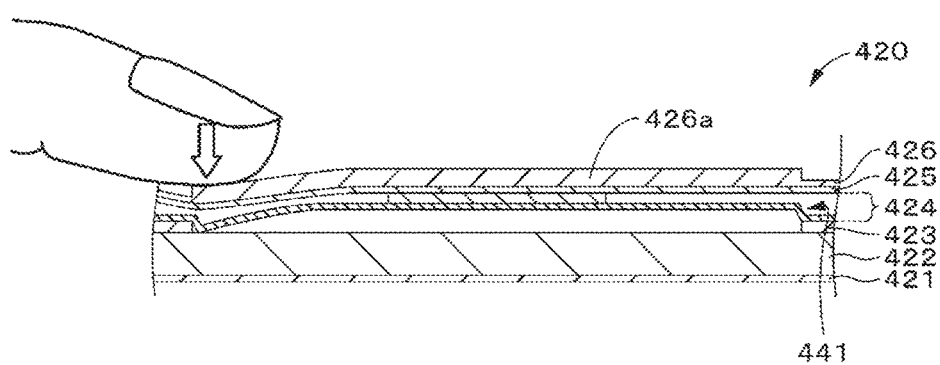
FIG. 2B is a cross-sectional view for explaining an example of an operation of the sensor module when a peripheral portion of the key.

In the sensor module 420 having the configuration described above, as shown in FIG. 2A, when the center of the key 426a is pressed, the structure 441 is inverted, and thus a positional relationship between a top side of the structure 441 and a bottom side of the structure 441 is vertically switched. As a result, a sense of click can be obtained. On the other hand, as shown in FIG. 2B, when a peripheral portion of the key 426a is pressed, the peripheral portion of the structure 441 is only locally deformed, and the structure 441 is not inverted, so the sense of click cannot be obtained. Accordingly, as shown in FIG. 1B, on a center area R1 of a key operation area Rp, a click is likely to be generated, and in a peripheral area R2, the sense of click is unlikely to be generated, so an area where the sense of click can be obtained is reduced. This phenomenon markedly occurs in the case where the sensor module 420 is made of a soft, thin film, because an operation surface is easily deformed due to an operation load.

In view of this, the inventors of the present technology have earnestly studied a sensor module that can increase an area where the sense of click can be generated, that is, an area where a reaction force nonlinearly changes with respect to a position pressed by the operator. As a result, the inventors have studied out a sensor module which is provided with two or more laminated-structured structure layers, and in which two or more structures are disposed for a key operation area corresponding to a key, and the two or more structures are disposed with the structures separated into two or more layers. In the following, a description will be given on a sensor module having the configuration and an electronic apparatus provided with the same.

[1.2 Configuration of Electronic Apparatus]

Figure 3:
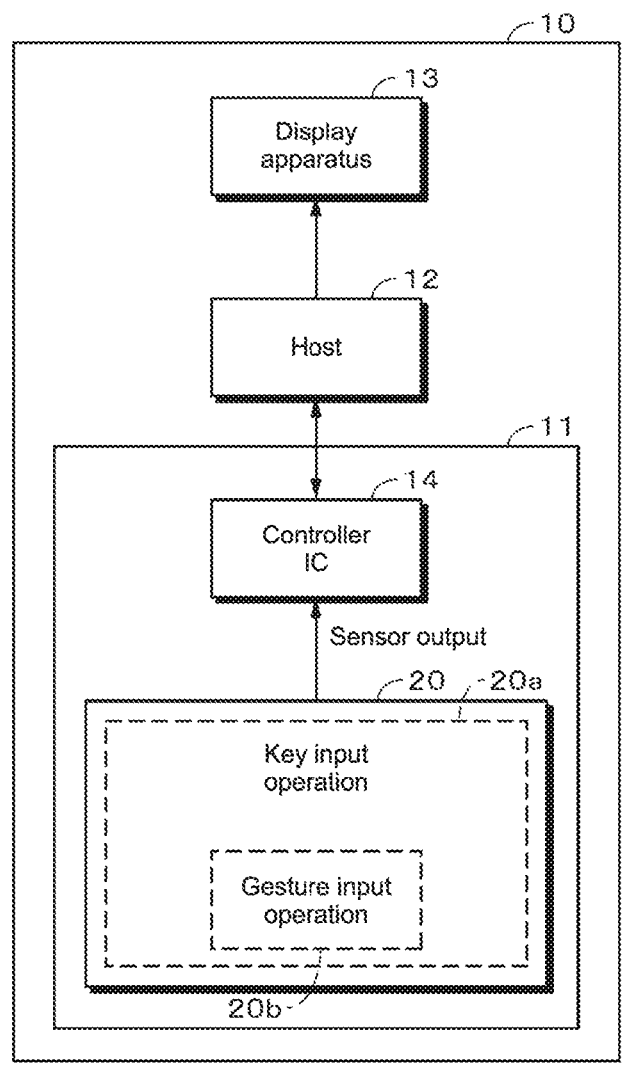
FIG. 3 is a block diagram showing an example of a configuration of an electronic apparatus according to a first embodiment of the present technology.

As shown in FIG. 3, an electronic apparatus 10 is provided with a keyboard 11, a host 12 as a main body of the electronic apparatus 10, and a display apparatus 13. It should be noted that, in FIG. 3, the keyboard 11 is provided in the electronic apparatus 10, and the keyboard 11 and the electronic apparatus 10 are integrally configured. However, such a configuration that the keyboard 11 is provided as a peripheral apparatus outside of the electronic apparatus 10 may be used. Further, the display apparatus 13 is provided in the electronic apparatus 10, and the display apparatus 13 and the electronic apparatus 10 are integrally configured. However, the configuration may be used in which the display apparatus 13 is provided as a peripheral apparatus in the outside of the electronic apparatus 10.

Examples of the electronic apparatus 10 include a personal computer, a mobile phone such as a smartphone, a tablet computer, a television, a camera, a mobile game machine, a car navigation system, and a wearable apparatus, but the electronic apparatus 10 is not limited to those.

(Keyboard)

The keyboard 11 is an example of an input apparatus, and is provided with a sensor module (sensor) 20 and a controller IC (Integrated Circuit) 14. The sensor module 20 can perform both of a key input operation 20a and a gesture input operation 20b. The sensor module 20 detects a change in capacitance in response to an input operation and outputs an electrical signal corresponding thereto to the controller IC 14. On the basis of the electrical signal supplied from the sensor module 20, the controller IC 14 outputs information corresponding to the operation with respect to the sensor module 20 to the host 12. For example, the controller IC 14 outputs information relating to a pressed key (for example, scan code), coordinate information, or the like.

(Host)

On the basis of the information supplied from the keyboard 11, the host 12 performs various processes. For example, the host 12 performs processes of displaying character information with respect to the display apparatus 13, moving a cursor displayed on the display apparatus 13, or the like.

(Display Apparatus)

On the basis of an image signal, a control signal, and the like supplied from the host 12, the display apparatus 13 displays an image (screen). Examples of the display apparatus 13 include a liquid crystal display, an electro-luminescence (EL) display, a CRT (Cathode Ray Tube) display, and a plasma display panel (PDP), but the display apparatus 13 is not limited thereto.

[1.3 Configuration of Sensor Module]

Figure 4A:
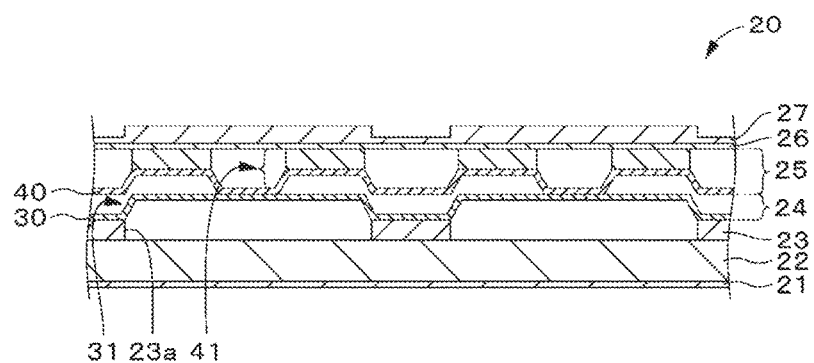
FIG. 4A is a cross-sectional view showing an example of a configuration of the sensor module according to the first embodiment of the present technology.

Hereinafter, with reference to FIG. 4A and FIG. 4B, an example of the configuration of the sensor module 20 will be described. The sensor module 20 is provided with a reference electrode layer 21 as a first conductive layer, a sensor layer 22, an intermediate layer (spacer layer) 23, a first structure layer 24 including a plurality of first structures 31, a second structure layer 25 including a plurality of second structures 41, a reference electrode layer 26 as a second conductive layer, and a key top layer 27. The sensor module 20 has an operation surface with flexibility. Here, a description will be given on the case where the structure layer has two-layer laminated structure constituted of the first and second structure layers 24 and 25. However, the laminated structure is not limited to this example and may include two or more layers. In the following, of both main surfaces of the sensor module 20 and configuration elements (configuration members), a main surface on an operation surface side is referred to as a front surface (first surface), and a main surface opposite thereto is referred to as back surface (second surface) as appropriate.

The sensor module 20 electrostatically detects a change in distance between the reference electrode layer 26 and the sensor layer 22 due to an input operation with respect to the key top layer 27, thereby detecting the input operation. The input operation is a key input operation with respect to the key top layer 27 or a gesture operation on the key top layer 27.

The reference electrode layer 26 is disposed on the front surface side of the sensor layer 22 at a predetermined interval, and the reference electrode layer 21 is disposed so as to be adjacent thereto on the back surface side. In this way, the reference electrode layers 21 and 26 are disposed on the both sides of the sensor layer 22, with the result that an external noise (external electrical field) can be prevented from entering the sensor module 20.

Between the sensor layer 22 and the reference electrode layer 26, the intermediate layer 23, the first structure layer 24, and the second structure layer 25 are provided in this order from the sensor layer 22 toward the reference electrode layer 26. The plurality of first and second structures 31 and 41 separate the reference electrode layer 26 and the intermediate layer 23, thereby forming a predetermined space.

(Reference Electrode Layer)

The reference electrode layer 21 configures the back surface of the sensor module 20, and is disposed so as to be opposed to the reference electrode layer 26 in a thickness direction of the sensor module 20. The reference electrode layer 21 has a higher flexural rigidity than the sensor layer 22, the reference electrode layer 26, and the like, for example, and functions as a support plate for the sensor module 20.

As the reference electrode layer 26, a conductive layer or a conductive base material can be used. The conductive base material is provided with a base material and a conductive layer disposed on a front surface thereof, for example. The base material has a film shape or a plate shape, for example. Here, the film includes a sheet. The conductive layer only has to have an electrically conductive property. For example, an inorganic conductive layer including an inorganic-based conductive material, an organic conductive layer including an organic-based conductive material, an organic-inorganic conductive layer including both of an inorganic-based conductive material and an organic-based conductive material, or the like can be used therefor.

Examples of the inorganic-based conductive material include metal and a metal oxide. Here, it is defined that the metal includes half metal. Examples of the metal include aluminum, copper, silver, gold, platinum, palladium, nickel, tin, cobalt, rhodium, iridium, iron, ruthenium, osmium, manganese, molybdenum, tungsten, niobium, tantalum, titanium, bismuth, antimony, lead, and an alloy thereof, but the metal is not limited to those. Examples of the metal oxide include an indium tin oxide (ITO), a zinc oxide, an indium oxide, an antimony-added tin oxide, a fluorinated tin oxide, aluminum-added zinc oxide, a gallium-added zinc oxide, a silicon-added zinc oxide, a zinc oxide-tin oxide system, an indium oxide-tin oxide system, and a zinc oxide-indium oxide-magnesium oxide system, but the metal oxide is not limited to those.

Examples of the organic conductive material include a carbon material and a conductive polymer. Examples of the carbon material include carbon black, carbon fiber, fullerene, graphene, carbon nanotube, carbon micro coil, and nanohorn, but the organic conductive material is not limited to those. Examples of the conductive polymer include substituted or non-substituted polyaniline, polypyrrole, polythiophene, and a (co)polymer constituted of one or two selected from those, but the conductive polymer is not limited to those.

As the reference electrode layer 21, specifically, for example, a metal plate including a metal material such as an Al alloy and a Mg alloy, a conductive plate such as a carbon fiber reinforced plastic, or a laminated body in which a conductive layer such as a plating film, a deposited film a sputtering film, and a metal foil is formed on an insulation layer including a plastic material and the like can be used. The reference electrode layer 21 is connected to a ground potential, for example.

The shape of the reference electrode layer 21 may be a flat plate shape, for example, but is not limited to this. For example, the reference electrode layer 21 may have a step portion. Further, the reference electrode layer 21 may have one or a plurality of openings formed thereon. Further, the reference electrode layer 21 may have a mesh-like configuration.

The reference electrode layer 26 has flexibility. Therefore, the reference electrode layer 26 can be deformed in accordance with pressing of the operation surface. The reference electrode layer 26 is a conductive layer or a conductive film having flexibility, for example. The conductive film is provided with a film as a base material and a conductive layer provided on a front surface thereof, for example. For the material of the conductive layer, a material similar to that of the conductive layer of the reference electrode layer 21 described above can be cited as an example.

As the conductive film, specifically, for example, a stainless used steel (SUS) film, a carbon printed film, an ITO (Indium Tin Oxide) film, a metal evaporation film on which metal such as Cu is evaporated can be used. The reference electrode layer 26 is connected to a ground potential, for example.

(Sensor Layer)

The sensor layer 22 is disposed between the reference electrode layer 21 and the reference electrode layer 26, and can electrostatically detect a change in distance to the reference electrode layer 26 on the operation surface side. Specifically, the sensor layer 22 includes a plurality of detection units 22s, and the plurality of detection units 22s detects a capacitance that is changed depending on the distance to the reference electrode layer 26.

Figure 4B:
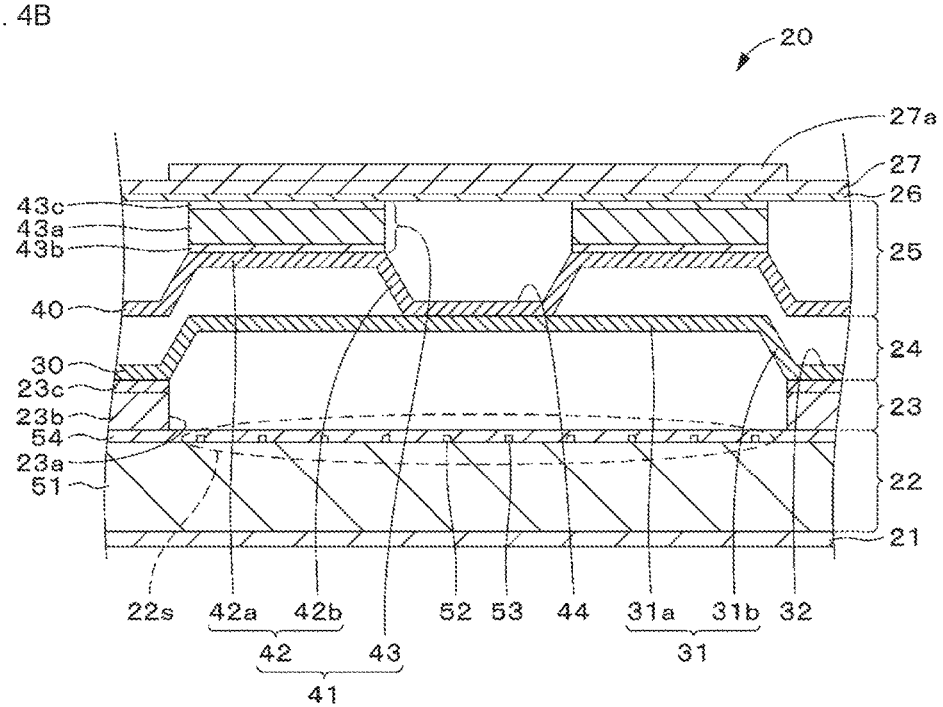
FIG. 4B is a cross-sectional view showing a part of the sensor module shown in FIG. 4A in an enlarged manner.

As shown in FIG. 4B, the sensor layer 22 is a capacitance type sensor layer and is provided with a base material 51, a plurality of X electrodes 52, a plurality of Y electrodes 53, and an insulation layer 54. It should be noted that in this specification, an X axis and a Y axis mean axes that are orthogonal to each other in the front surface of the base material 51. The plurality of X electrodes 52 and the plurality of Y electrodes 53 are disposed on the front surface of the base material 51. The insulation layer 54 is disposed on the front surface of the base material 51 so as to cover the plurality of X electrodes 52 and the plurality of Y electrodes 53. The combination of the X electrodes 52 and the Y electrodes 53 constitute the plurality of detection units 22s. The plurality of detection units 22s is two-dimensionally arranged on the front surface of the base material 51 in accordance with the key arrangement of the sensor module 20.

As the base material 51, for example, polymer resin film or a glass substrate can be used. Examples of a material of the polymer resin film include polyethylene terephthalate (PET), polyethylene naphthalate (PEN), polycarbonate (PC), acrylic resin (PMMA), polyimide (PI), triacetylcellulose (TAC), polyester, polyamide (PA), aramid, polyethylene (PE), polyacrylate, polyether sulfone, polysulfone, polypropylene (PP), diacetyl cellulose, polyvinyl chloride, epoxy resin, urea resin, urethane resin, melamine resin, cyclic olefin polymer (COP), and norbornene-based thermoplastic resin.

As a material of the insulation layer 54, an inorganic material or an organic material may be used. Examples of the inorganic material include $SiO_2$, $SiNx$, $SiON$, $Al_2O_3$, $Ta_2O_5$, $Y_2O_3$, $HfO_2$, $HfAlO$, $ZrO_2$, $TiO_2$. Examples of the organic material include polyacrylate such as PMMA (polymethylmethacrylate), PVA (polyvinyl alcohol), PS (polystyrene), transparent polyimide, polyester, epoxy, polyvinyl phenol, and polyvinyl alcohol.

(X and Y Electrodes)

Hereinafter, with reference to FIG. 5A, FIG. 5B, and FIG. 6A, an example of the configuration of the X and Y electrodes 52 and 53 will be described. Note that, in FIG. 5A, FIG. 5B, and FIG. 6A, for ease of illustration, such a configuration that the detection units 22s are two-dimensionally arranged in a matrix pattern is shown. As described above, the arrangement of the detection units 22s is selected depending on the key arrangement of the sensor module 20. The two-dimensional arrangement in the matrix pattern is merely an example, and the arrangement is not limited to this.

Figure 5A:
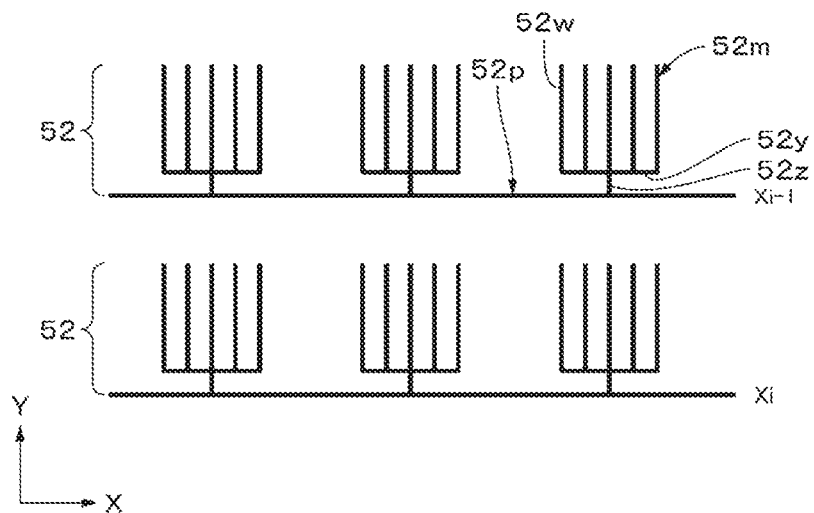
FIG. 5A is a plan view showing an example of a configuration of an X electrode.

As shown in FIG. 5A, the X electrode 52 as a first electrode is provided with an electrode line portion 52p, a plurality of unit electrode bodies 52m, and a plurality of connection portions 52z. The electrode line portion 52p is extended in the X axis direction. The plurality of unit electrode bodies 52*m* is disposed at constant intervals in the X axis direction. The electrode line portion 52*p* and the unit electrode bodies 52*m* are separated with a predetermined interval, and are connected by the connection portions 52*z*. It should be noted that the connection portions 52*z* may be omitted, and the unit electrode bodies 52*m* may be directly provided on the electrode line portion 52*p*.

The unit electrode bodies 52*m* has a comb-like shape as a whole. Specifically, the unit electrode body 52*m* is provided with a plurality of sub electrodes 52*w* and a combining portion 52*y*. The plurality of sub electrodes 52*w* is extended in a Y axis direction. Adjacent sub electrodes 52*w* are separated at a predetermined interval. One end of each of the plurality of sub electrodes 52*w* is connected to the combining portion 52*y* extended in the X axis direction.

Figure 5B:
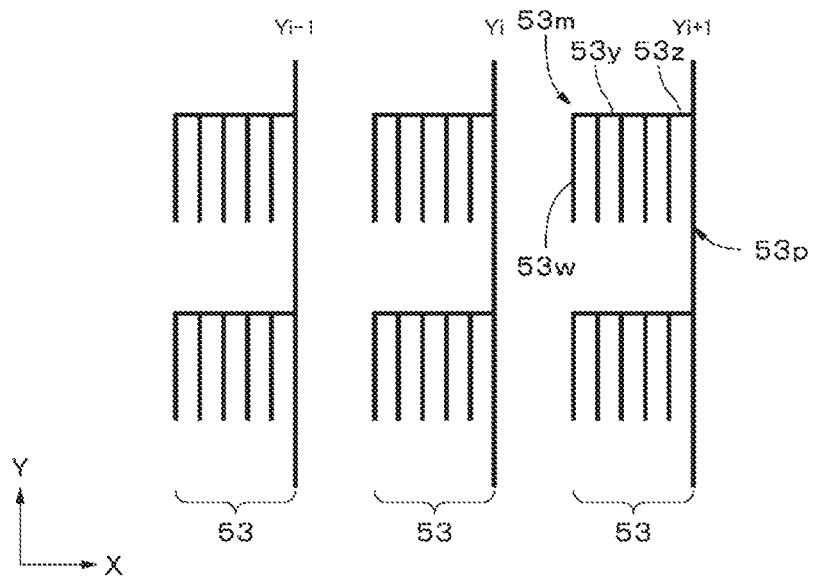
FIG. 5B is a plan view showing an example of a configuration of a Y electrode.

As shown in FIG. 5B, the Y electrode 53 as a second electrode is provided with an electrode line portion 53*p*, a plurality of unit electrode bodies 53*m*, and a plurality of connection portions 53*z*. The electrode line portion 53*p* is extended in the Y axis direction. The plurality of unit electrode bodies 53*m* is disposed at constant intervals in the Y axis direction. The electrode line portion 53*p* and the unit electrode bodies 53*m* are separated at a predetermined interval, and are connected by the connection portions 53*z*.

The unit electrode bodies 53*m* has a comb-like shape as a whole. Specifically, the unit electrode body 53*m* is provided with a plurality of sub electrodes 53*w* and a combining portion 53*y*. The plurality of sub electrodes 53*w* is extended in the Y axis direction. Adjacent sub electrodes 53*w* are separated at a predetermined interval. One end of each of the plurality of sub electrodes 53*w* is connected to the combining portion 53*y* extended in the X axis direction.

Figure 6A:
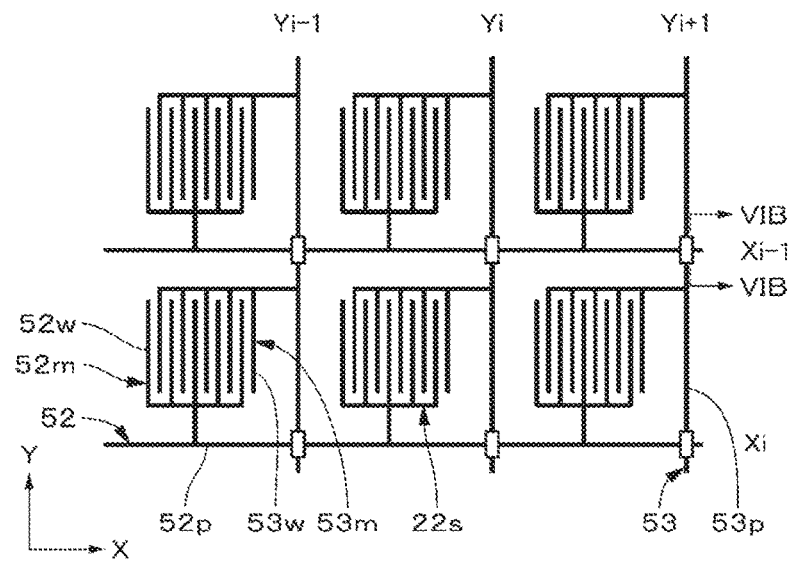
FIG. 6A is a plan view showing an example of an arrangement of the X and Y electrodes.

As shown in FIG. 6A, the plurality of sub electrodes 52*w* of the unit electrode body 52*m* and the plurality of sub electrodes 53*w* of the unit electrode body 53*m* are alternately disposed in the X axis direction. The sub electrodes 52*w* and 53W are separated at predetermined intervals. When a voltage is applied between the X and Y electrodes 52 and 53, the sub electrodes 52*w* and 53*w* that are adjacent in an in-plane direction of the base material 51 form a capacitive coupling. In a state in which the voltage is applied between the X and Y electrodes 52 and 53, when the reference electrode layer 26 approaches the sensor layer 22 (that is, detection units 22*s*) by an input operation, a capacitance between the adjacent sub electrodes 52*w* and 53*w* changes. Thus, a capacitance of the entire detection units 22*s* constituted of a set of unit electrode bodies 52*m* and 53*m* changes. On the basis of the change in capacitance of the entire detection units 22*s*, the controller IC 14 determines which of the gesture and key input operations is performed with respect to the operation surface.

Figure 6B:
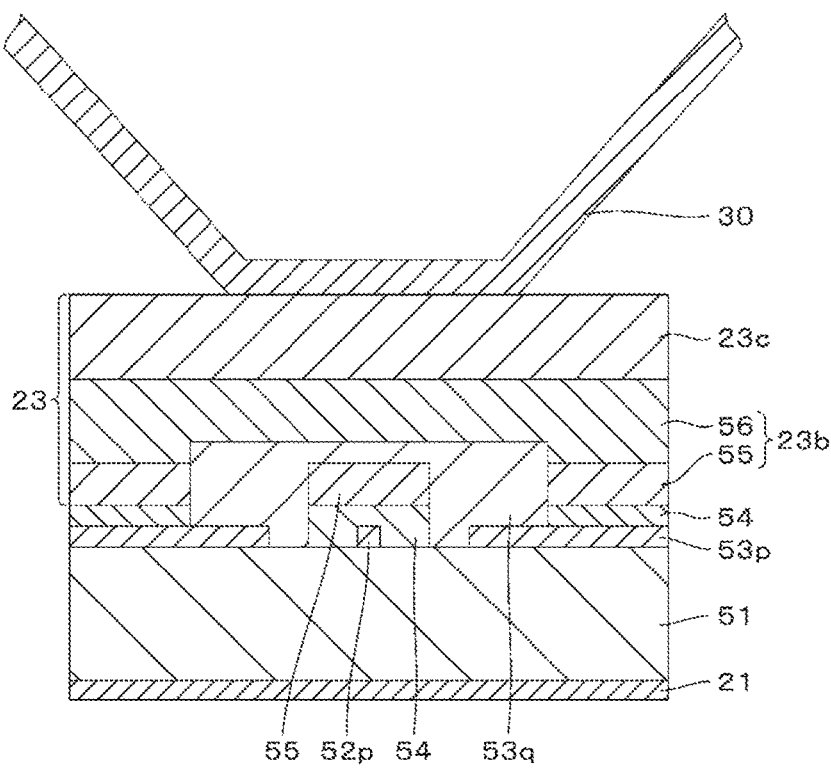
FIG. 6B is a cross-sectional view taken along the line VIB-VIB of FIG. 6A.

As shown in FIG. 6B, on the electrode line portion 52*p* of the X electrode 52, the insulation layer 54 and an insulation layer 55 are provided, and a jumper wiring 53*q* is provided in such a manner that the jumper wiring strides over the insulation layers 54 and 55, and end portions of the electrode line portions 53*p* are electrically connected. On the jumper wiring 53*q*, an insulation layer 56, an adhesive layer 23*c* is laminated. The X and Y electrodes 52 and 53 are covered with the insulation layer 54 as shown in FIG. 4B.

(First Structure Layer)

The first structure layer 24 is provided between the second structure layer 25 and the intermediate layer 23. The plurality of first structures 31 included in the first structure layer 24 separates the second structure layer 25 and the intermediate layer 23, thereby forming a predetermined space. The first structure layer 24 is configured by a first embossed layer (uneven layer) 30 having an uneven shape. The first structures 31 is configured by a protruded portion of the uneven shape of the first embossed layer 30. A back surface side of the protruded portion is depressed, and the inside of the protruded portion is hollow. Between the protruded portions, a flat portion 32 is provided. The flat portion 32 is bonded to the intermediate layer 23, for example, with the result that the first structure layer 24 is fixed to the front surface of the intermediate layer 23.

The first structure 31, which is the protruded portion is a reaction force structure, the reaction force of which is nonlinearly changed with respect to a pressing amount (with respect to an operation load). The first structures 31 is provided with a top portion 31*a* and a buckling portion 31*b*. It is desirable that the shape of first structures 31 be a conical frustum or a pyramid frustum. Having the shape can keep a height thereof to be lower as compared to the case of having a dome shape. It should be noted that the shape of the first structures 31 as the protruded portion is not limited to this, and another shape can be used therefor.

Figure 7A:
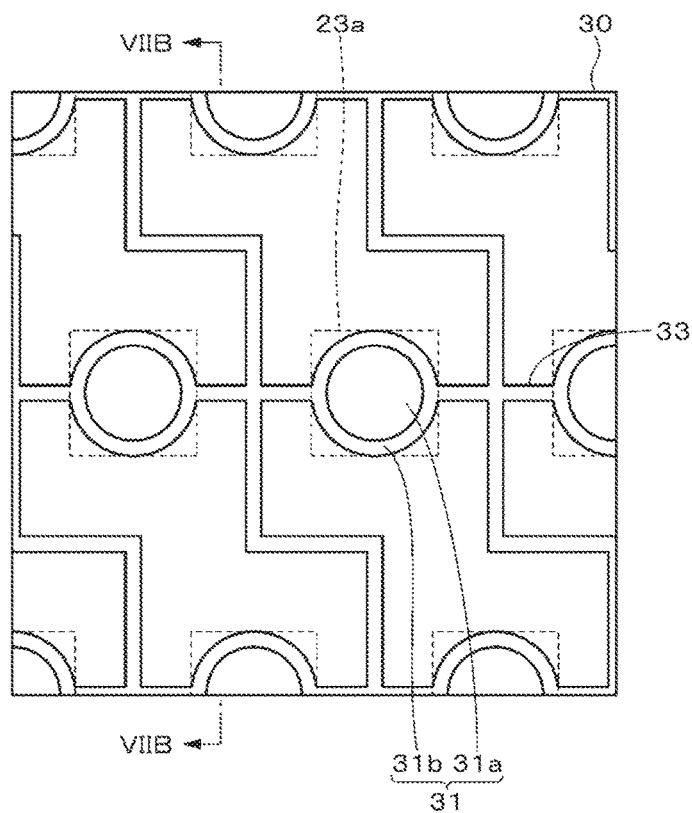
FIG. 7A is a top view showing an example of the configuration of the sensor module in a state in which a key top layer, the reference electrode layer, and a second structure layer are excluded.
Figure 7B:
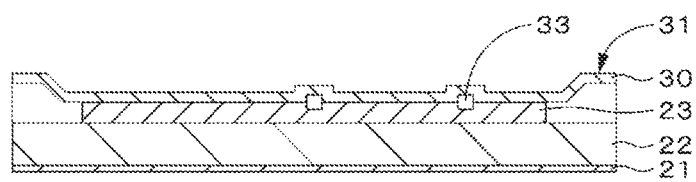
FIG. 7B is a cross-sectional view taken along the line VIIB-VIIB of FIG. 7A.

As shown in FIG. 7A, the first embossed layer 30 has a vent 33. The vent 33 causes adjacent first structures 31 to be communicated. When the first structures 31 is pressed, through the vent 33, air in an inside space of the first structures 31 is let out. As shown in FIG. 7B, the vent 33 is a hole portion that is configured by a groove formed on the back surface of the first embossed layer 30 and the front surface of the intermediate layer 23. On the front surface of the intermediate layer 23, a groove may also be formed on a part that faces the groove of the first structure layer 24, and the groove on the back surface of the first structure layer 24 and the groove on the front surface of the intermediate layer 23 may be fitted to configure the vent 33.

As the first embossed layer 30, an embossed film is desirably used. As a material of the film, for example, a polymer resin material can be used. Examples of the polymer resin material include polyethylene terephthalate (PET), polyethylene naphthalate (PEN), polycarbonate (PC), acrylic resin (PMMA), polyimide (PI), triacetylcellulose (TAC), polyester, polyamide (PA), aramid, polyethylene (PE), polyacrylate, polyether sulfone, polysulfone, polypropylene (PP), diacetyl cellulose, polyvinyl chloride, epoxy resin, urea resin, urethane resin, melamine resin, cyclic olefin polymer (COP), and norbornene-based thermoplastic resin.

(Second Structure Layer)

The second structure layer 25 is provided between the reference electrode layer 26 and the first structure layer 24. A plurality of second structures 31 included in the second structure layer 25 separates the reference electrode layer 26 and the first structure layer 24, thereby forming a predetermined space. The second structure layer 25 is constituted of a second embossed layer (uneven layer) 40 having an uneven shape and a plurality of pressure bodies 43, each of which is formed on a top portion 42*a* of a plurality of protruded portions 42 of the second embossed layer 40. The second structures 41 are constituted of the protruded portions 42 and the pressure bodies 43 formed on the top portions 42*a* of the protruded portions 42. The back surface side of the protruded portion 42 is depressed, and the inside of the protruded portions 42 is hollow. Between the protruded portions 42, a flat portion 44 is formed. The flat portion 44 is formed on the top portion 31*a* of the first structure 31. The flat portion 44 may be fixed by bonding on the top portion 31*a* of the first structure 31 through an adhesive layer, for example.

The protruded portion 42 is a reaction force structure, the reaction force of which is nonlinearly changed with respect to the pressing amount (with respect to an operation load). The protruded portion 42 is provided with the top portion 42a and a buckling portion 42b. It is desirable that the shape of the protruded portion 42 be a conical frustum or a pyramid frustum. Having the shape can keep a height thereof to be lower as compared to the case of having a dome shape. It should be noted that the shape of the protruded portion 42 is not limited to this, and another shape can be used.

The pressure bodies 43 is a two-sided adhesive film, for example, and is provided with a resin layer 43a and adhesive layers 43b and 43c which are provided on both sides of the resin layer 43a, respectively. The pressure bodies 43 is bonded to the front surface of the top portion 42a of the protruded portions 42 through the adhesive layer 43b and is bonded to the back surface of the reference electrode layer 26 through the adhesive layer 43c.

The second embossed layer 40 may have a vent as necessary. It is desirable that an embossed film be used as the second embossed layer 40. As a material of the film, for example, a material similar to that of the first embossed layer 30 can be used.

(Arrangement of First and Second Structures)

For the key operation area Rp corresponding to a key 27a, one or a plurality of first structures 31 and one or a plurality of second structures 31 are disposed. Specifically, the plurality of first structures 31 is disposed in such a manner that at least one or the plurality of first structures 31 is included in each key operation area Rp of the first structure layer 24. Further, the plurality of second structures 41 is disposed in such a manner that at least one or the plurality of second structures 41 is included in each key operation area Rp of the second structure layer 25.

It is desirable that the first and second structures 31 and 41 be disposed so as not to be overlapped in the thickness direction of the sensor module 20, that is, in a direction in which the operation load is applied. For example, in first structure layer 24, the first structure 31 is disposed on the center of the key operation area Rp, and in the second structure layer 25, the second structures 41 are disposed on the periphery of the key operation area Rp. Conversely, in the first structure layer 24, the first structures 31 may be disposed on the periphery of the key operation area Rp, and in the second structure layer 25, the second structure 41 may be disposed on the center of the key operation area Rp.

Figure 8A:
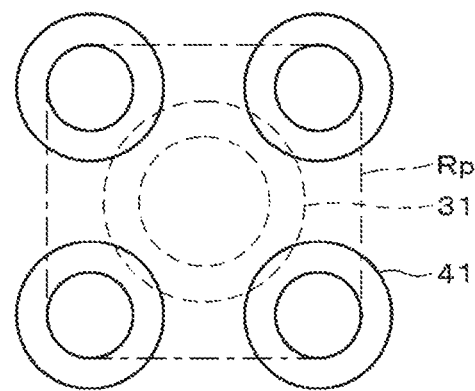
FIG. 8A is a plan view showing an example of an arrangement of first and second structures.
Figure 8B:
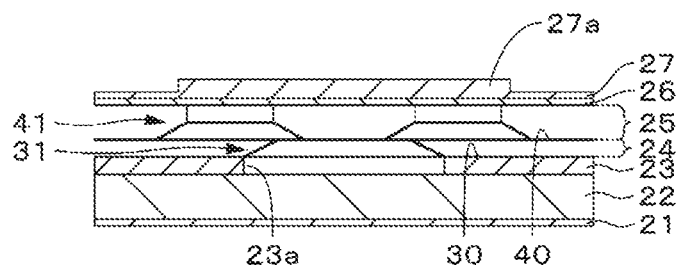
FIG. 8B is a cross-sectional view showing an example of the arrangement of the first and second structures.
Figure 8C:
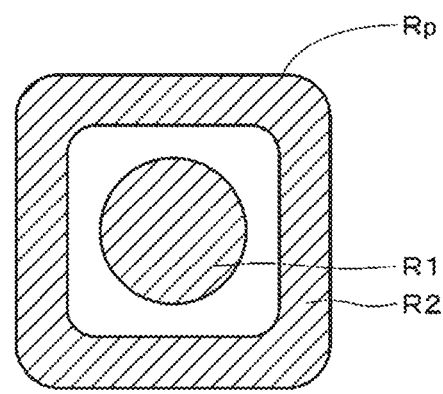
FIG. 8C is a schematic diagram showing the area where the sense of click is likely to be generated and the area where the sense of click is unlikely to be generated.

For example, as shown in FIG. 8A and FIG. 8B, in the operation area Rp having a substantially rectangular shape, one first structure 31 and the plurality of second structures 41 are disposed. The one first structure 31 is disposed on the center of the operation area Rp, and the plurality of second structures 41 is disposed on positions of the peripheral portion of the operation area Rp. For example, four second structures 41 are disposed at respective corner portions of the operation area Rp. With this arrangement, for example, as shown in FIG. 8C, in the center area R1 of the operation area Rp, the sense of click can be obtained because of the first structure 31. In the peripheral area R2 of the operation area, the sense of click can be obtained because of the second structures 41. Thus, in both of the center area R1 and the peripheral area R2 of the operation area Rp, the sense of click is likely to be generated, so an area where the sense of click can be obtained is increased. Here, the operation area Rp means an area corresponding to the operation surface of the key 27a. It should be noted that the arrangement and the number of first and second structures 31 and 41 are not limited to the above example, and different arrangement and number thereof can be used. For example, one second structure 41 may be disposed on the center of the operation area Rp, and the plurality of first structures 31 may be disposed on the peripheral portion of the operation area Rp. For example, four first structures 31 may be disposed at respective corners of the operation area Rp.

(Intermediate Layer)

The intermediate layer 23 is provided with a main body layer 23b of the intermediate layer 23 and the adhesive layer 23c formed on the front surface of the main body layer 23b. Further, the intermediate layer 23 has a plurality of hole portions 23a. The hole portions 23a are through holes that penetrate the intermediate layer 23 from the front surface to the back surface, for example. The plurality of hole portions 23a is formed on positions corresponding to the plurality of detection units 22s. That is, when viewed in a direction vertical to the operation surface, the plurality of hole portions 23a is formed on such positions as to coincide with the plurality of detection units 22s, respectively. In the case where the first structure 31 is provided on the center of the key operation area Rp, the plurality of hole portions 23a is positioned immediately below the plurality of first structures 31, respectively. As a result, in the case where the key input operation is performed, the top portion 31a of the first structure 31 can be inverted to enter the hole portion 23a. The intermediate layer 23 is configured by screen print, a molded film, or the like, for example.

It is desirable that an inner circumference of the first structure 31 on a bottom portion side thereof be in substantially contact with an outer circumference of the hole portion 23a of the intermediate layer 23. More specifically, for example, in the case where the hole portion 23a of the intermediate layer 23 has a square outer circumference, and the first structure 31 has the conical frustum shape, it is desirable that the inner circumference of the bottom portion of the first structures 31 be in substantially in contact with the outer circumference of the hole portion 23a of the intermediate layer 23.

When the first structures 31 is inverted, an abrupt change in reaction force is caused. In the state in which the first embossed layer 30 is fixed to the intermediate layer 23, in order to invert the first structure 31, that is, to switch a vertical positional relationship between the top portion and the bottom portion of the first structure 31, it is desirable that the hole portion 23a have a depth to some extent. This is because the configuration improves the sense of click. Further, it is desirable that the depth of the hole portion 23a be equal to or less than the height of the first structure 31. In the case where the depth of the hole portion exceeds the height of the first structure 31, there is a fear that the first structure 31 may not be returned after being inverted.

As shown in FIG. 6B, the intermediate layer 23 is constituted of the insulation layers 55 and 56 laminated on the insulation layer 54 and the adhesive layer 23c. The intermediate layer 23 and the first embossed layer 30 are bonded with each other through the adhesive layer 23c.

(Key Top Layer)

The key top layer 27 has flexibility. Thus, the key top layer 27 can be deformed in response to pressing of the operation surface along with the reference electrode layer 26. As the key top layer 27, for example, a resin film, a metal plate having flexibility, or the like can be used. On the front surface (surface as an input side) of the key top layer 27, a plurality of keys 27a is arranged. On the key 27a, a character, a symbol, a function, or the like is printed. By pressing or releasing the key 27a, information such as a scancode is output from the controller IC 14 to the host 12.

(Controller IC)

On the basis of an electrical signal depending on a change in capacitance, which is supplied from the sensor module 20, the controller IC 14 determines which of the gesture and key input operations is performed for the operation surface, and outputs information corresponding to a determination result to the host 12. Specifically, the controller IC 14 has two threshold values A and B, and performs the determination described above on the basis of the threshold values A and B. For example, when it is determined that the gesture input operation is performed, coordinate information is output to the host 12. Further, when it is determined that the key input operation is performed, information relating to a key such as a scancode to the host 12.

[1.4 Operation of Sensor Module]

Hereinafter, with reference to FIG. 9A to FIG. 10C, a description will be given on an example of an operation of a sensor module 120 at the time of the gesture and key input operations.

(Gesture Input Operation)

Figure 10A:
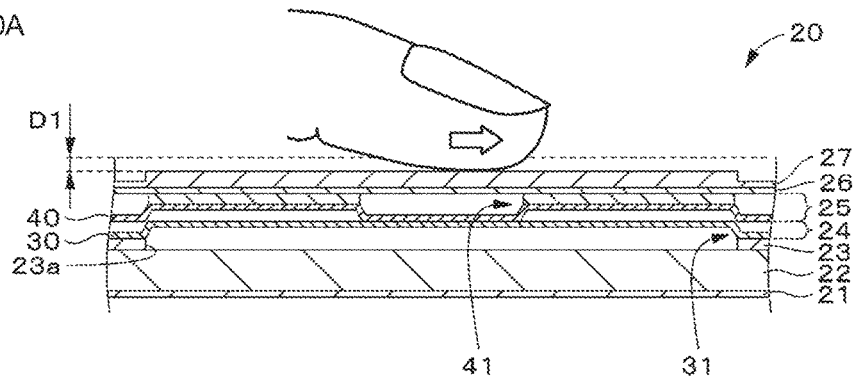
FIG. 10A is a cross-sectional view for explaining an example of an operation of the sensor module at a time when a gesture input operation is performed.

When the gesture input operation is performed for the front surface (operation surface) of the sensor module 20, as shown in FIG. 10A, the first structures 31 is slightly deformed and is shifted downwards from an initial position by a distance D1. As a result, a distance between the sensor layer 22 and the reference electrode layer 26 is slightly changed by the distance D1, and the capacitance between the unit electrode bodies 52$m$ and 53$m$. By the detection units 22$s$ in the sensor layer 22, the electrostatic capacitance change is detected and output to the controller IC 14 as the electrical signal.

(Key Input Operation)

Figure 9A:
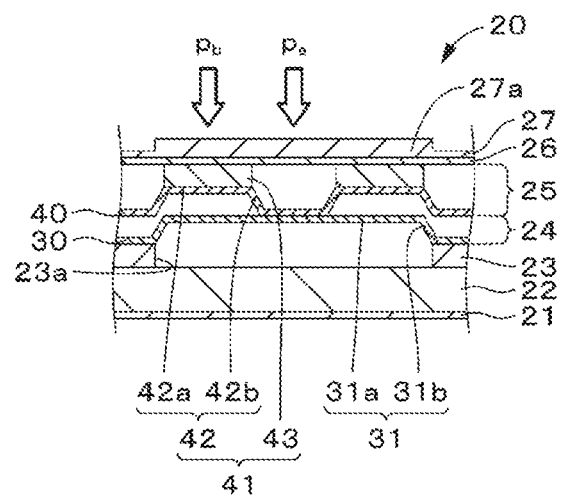
FIG. 9A is a cross-sectional view for explaining an example of a pressed position of a key at a time of a key input operation.
Figure 9B:
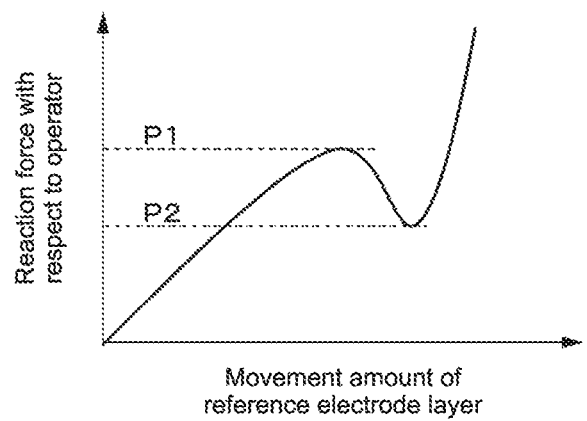
FIG. 9B is a graph showing an example of a relationship between a movement amount of a reference electrode at a time when the center of the key is pressed to perform the key input operation and a reaction force to an operator.
Figure 10B:
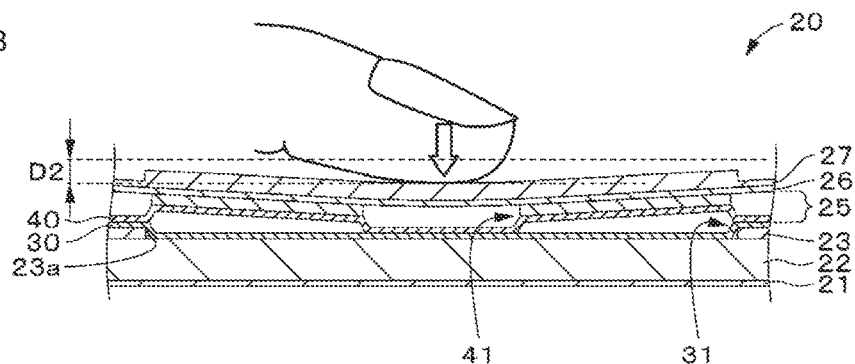
FIG. 10B is a cross-sectional view for explaining an example of an operation of the sensor module at a time when the center of the key is pressed to perform the key input operation.

As shown in FIG. 9A, by pressing a center position $p_a$ of the key 27$a$ (that is, key operation area Rp) of the sensor module to perform the key input operation, as shown in FIG. 10B, the first structure 31 is inverted and shifted from an initial position by a distance D2. As a result, the distance between the sensor layer 22 and the reference electrode layer 26 is largely changed by the distance D2, and the capacitance between the unit electrode bodies 52$m$ and 53$m$ is largely changed. By the detection units 22$s$ in the sensor layer 22, the electrostatic capacitance change is detected and output to the controller IC 14 as the electrical signal. In the key input operation as described above, a reaction force curve characteristic with respect to the operator is obtained as shown in FIG. 9B.

Figure 9C:
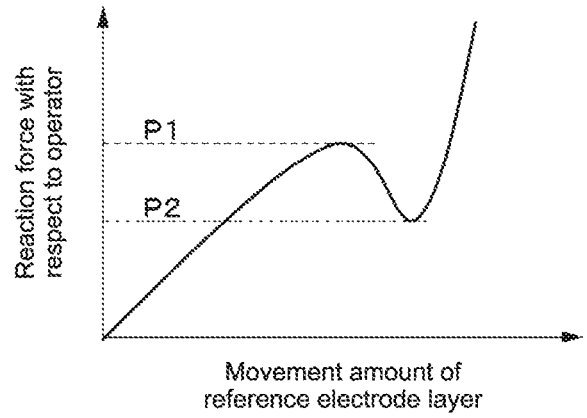
FIG. 9C is a graph showing an example of a relationship between a movement amount of the reference electrode at a time when a peripheral portion of the key is pressed to perform the key input operation and a reaction force to an operator.
Figure 10C:
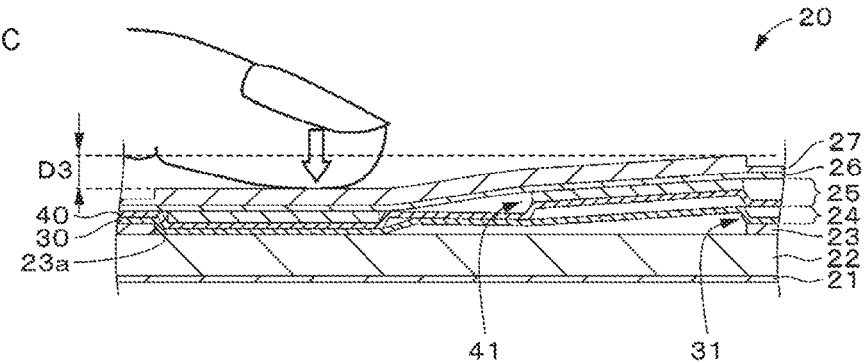
FIG. 10C is a cross-sectional view for explaining an example of an operation of the sensor module at a time when the peripheral portion of the key is pressed to perform the key input operation.

As shown in FIG. 9A, when a peripheral position $p_b$ the key 27$a$ (that is, key operation area Rp) of the sensor module is pressed, as shown in FIG. 10C, the first structure 31 is inverted and shifted from the initial position by a distance D3. As a result, the distance between the sensor layer 22 and the reference electrode layer 26 is largely changed by the distance D3, and the capacitance between the unit electrode bodies 52$m$ and 53$m$ is largely changed. By the detection units 22$s$ in the sensor layer 22, the electrostatic capacitance change is detected and output to the controller IC 14 as the electrical signal. In the key input operation as described above, a reaction force curve characteristic with respect to the operator is obtained as shown in FIG. 9C. Here, for ease of explanation, the reaction force curve characteristics of the first and second structures 31 and 41 are substantially the same, but the reaction force curve characteristics may be different between the first and second structures 31 and 41.

As described above, depending on positions where the input operation is performed, the first and second structures 31 and 41 respectively contribute to the generation of the sense of click, with the result that the click generation area can be increased.

[1.5 Change in Reaction Force and Capacitance with Respect to Pressing of Structure]

In the sensor module 20 having the configuration described above, as shown in FIG. 11A, the first and second structures 31 and 41 each have such a function that the reaction force to the operator is nonlinearly changed with respect to the movement amount of the reference electrode layer 26. Specifically, the first and second structures 31 and 41 each have such a function that the reaction force is increased in response to pressing by the operator up to the maximum value of P1, is decreased to a minimum value of P2 by further increasing the pressing amount, and is increased again by further pressing to a limit point of pressing deformation.

Figure 11A:
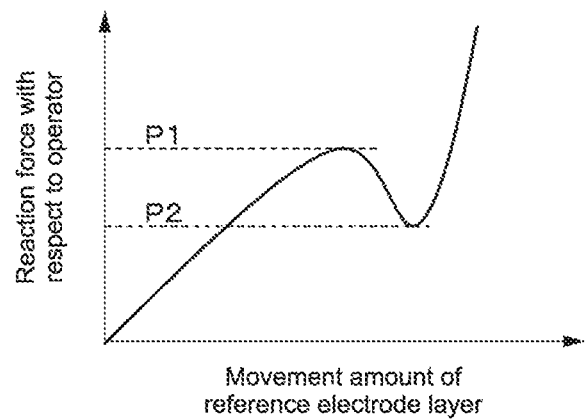
FIG. 11A is a graph showing an example of a relationship between a movement amount of a reference electrode and a reaction force to an operator.
Figure 11B:
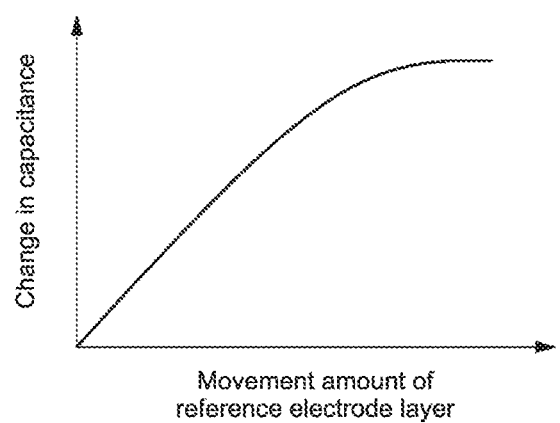
FIG. 11B is a graph showing an example of a relationship between the movement amount of the reference electrode and a capacitance change.
Figure 11C:
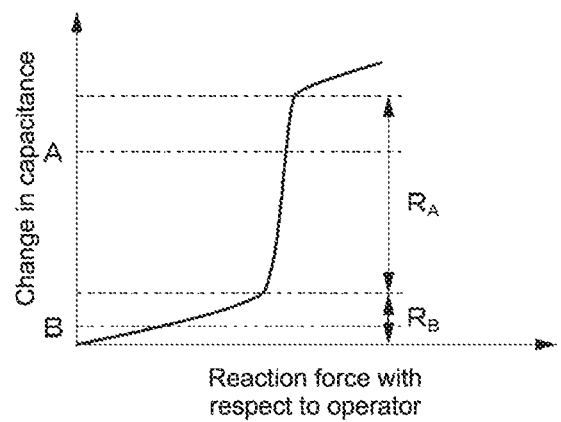
FIG. 11C is a graph showing an example of a relationship between the reaction force with respect to the operator and the capacitance change.

In the sensor module 20, the electrostatic capacitance change is monotonously increased with respect to the movement amount of the reference electrode layer 26 as shown in FIG. 11B. Further, as shown in FIG. 11C, the electrostatic capacitance is gradually changed in accordance with an increase in reaction force to the operator, is abruptly changed, and is then gradually changed again. In FIG. 11A, an area $R_B$ where the electrostatic capacitance is gradually changed first corresponds to an area from when the operator starts pressing from the initial position until the reaction force reaches the maximum value P1. Further, in FIG. 11A, an area $R_A$ where the electrostatic capacitance is abruptly changed corresponds to an area where the reaction force reaches the minimum value P2 from the maximum value P1.

A threshold value A is set in the area $R_A$, and whether the capacitance exceeds the threshold value A or not is determined, with the result that it is possible to determine whether the key input operation is performed for the operation surface or not. On the other hand, a threshold value B is set in the area $R_B$, and whether the capacitance exceeds the threshold value B or not is determined, with the result that it is possible to determine whether the gesture operation is performed for the operation surface or not.

[1.6 Operation of Controller IC]

Figure 12:
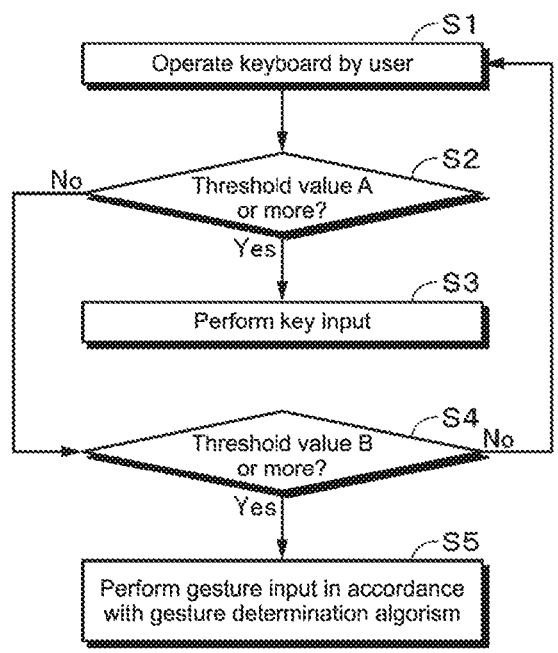
FIG. 12 is a flowchart for explaining an example of an operation of a controller IC.

Hereinafter, with reference to FIG. 12, a description will be given on an example of the operation of the controller IC 14.

First, in Step S1, when a user performs an input operation for the operation surface of the keyboard 11, in Step S2, on the basis of the electrical signal depending on the change in capacitance, which is supplied from the sensor module 20, the controller IC 14 determines whether the electrostatic capacitance change is equal to or more than the threshold value A or not. In the case where it is determined that the electrostatic capacitance change is equal to or more than the threshold value A in in Step S2, in Step S3, the controller IC 14 outputs information relating to the key such as a scancode to the host 12. As a result, a key input is performed. On the other hand, in Step S2, in the case where it is determined that the electrostatic capacitance change is not equal to or more than the threshold value A, the process proceeds to Step S4.

Subsequently, in Step S4, on the basis of the electrical signal depending on the change in capacitance, which is supplied from the sensor module 20, the controller IC 14 determines whether the electrostatic capacitance change is equal to or more than the threshold value B or not. In the case where it is determined that the electrostatic capacitance change is equal to or more than the threshold value B in Step S4, in Step S5, the controller IC 14 operates in accordance with a gesture determination algorism. As a result, the gesture input is performed. On the other hand, in the case where it is determined that the electrostatic capacitance change is not equal to or more than the threshold value B in Step S4, the process returns to Step S1.

[1.7 Effect]

In the sensor module 20 according to the first embodiment, for the key operation area Rp corresponding to the key 27a, one or more first structures 31 and one or more second structures are disposed. As a result, in the sensor module 20 having the operation surface that is flexibly deformed, it is possible to increase an area where the sense of click is generated (that is, area where the reaction force is nonlinearly changed with respect to a position pressed by the operator).

For the operation surface of the keyboard 11, two functions of a key input and a gesture cursor operation can be provided. As a result, it is possible to implement a keyboard function and a touchpad function in a small area. Further, it is possible to perform the gesture input after the key input without moving a hand to a large extent, resulting in an improvement of usability. Further, the great sense of click and stroke can be obtained even with a thin structure. Further, it is possible to manufacture the keyboard 11 stably at low cost. Further, a higher degree of freedom of the design of the keyboard 11 is obtained.

[1.8 Modified Examples]

Modified Example 1

Figure 13A:
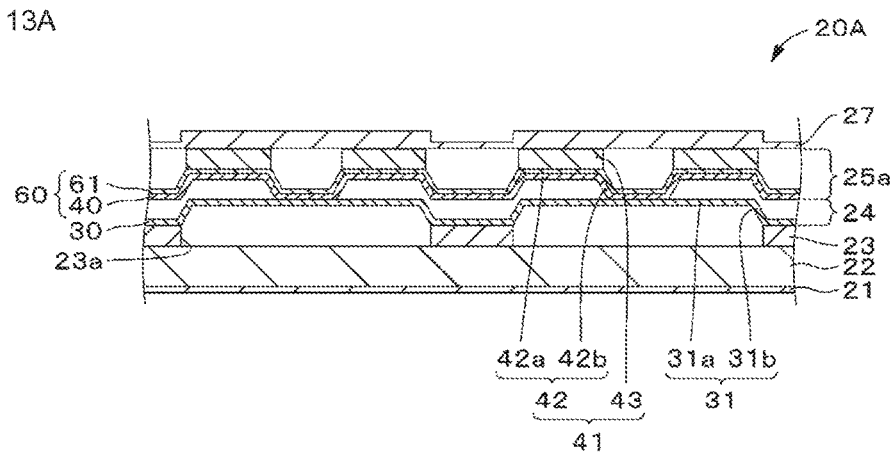
FIG. 13A is a cross-sectional view showing a first example of a configuration of a sensor module according to a modified example 1 of the first embodiment of the present technology.

As shown in FIG. 13A, a sensor module 20A according to a modified example 1 is different from the sensor module 20 (see FIG. 4A) according to the first embodiment in that a second structure layer 25a having conductivity is provided, and the reference electrode layer 26 between the second structure layer 25a and the key top layer 27 is omitted. It should be noted that in the modified example 1, parts similar to those in the first embodiment are denoted by the same symbols, and a description thereof will be omitted.

Figure 13B:
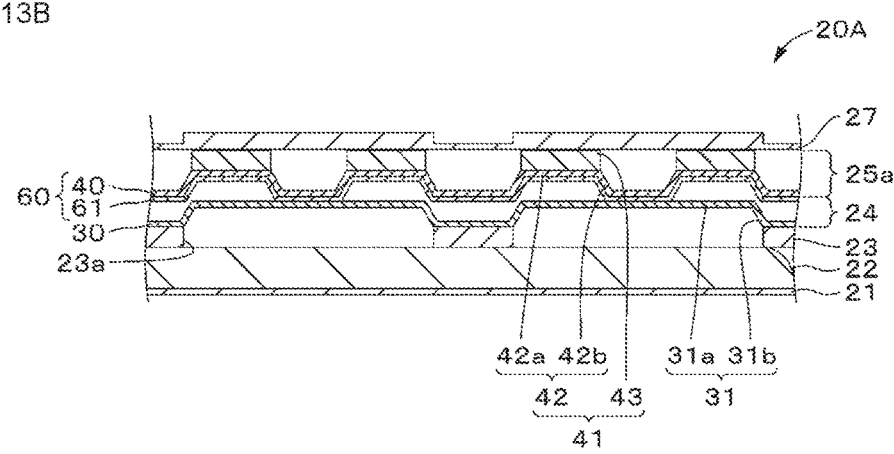
FIG. 13B is a cross-sectional view showing a second example of the configuration of the sensor module according to the modified example 1 of the first embodiment of the present technology.

The second structure layer 25a is provided with a conductive embossed layer 60 having an uneven shape and the plurality of pressure bodies 43 which are respectively provided on the top portions 42a of the plurality of protruded portions 42 included in the uneven shape. The conductive embossed layer 60 is provided with the second embossed layer 40 and a conductive layer 61 provided on a front surface thereof. The conductive layer 61 is provided so as to be modeled on the unevenness of the front surface of the second embossed layer 40. It should be noted that the configuration of the conductive embossed layer 60 is not limited to this example, and as shown in FIG. 13B, the conductive layer 61 may be provided on a back surface of the second embossed layer 40.

In the sensor module 20A having the configuration described above, depending on a change in distance between the conductive embossed layer 60 and the sensor layer 22, the capacitance between the adjacent sub electrodes 52w and 53w is changed. The change in capacitance is detected by the sensor layer 22. In this example, a description is given on the example in which the second structure layer 25a has conductivity. However, instead of the second structure layer 25, the first structure layer 24 may have conductivity. In this case, by forming the conductive layer on the front surface or the back surface of the first embossed layer 30, the first structure layer 24 can have conductivity.

Figure 14A:
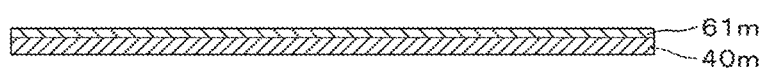
FIG. 14A, FIG. 14B, FIG. 14C, FIG. 14D each are process diagrams for explaining a method of manufacturing a conductive embossed layer.

Hereinafter, with reference to FIG. 14A to FIG. 14D, a description will be given on an example of a method of manufacturing the conductive embossed layer 60. First, as shown in FIG. 14A, by forming a conductive layer 61m on one main surface of a resin film 40m, a conductive film is manufactured. As a material of the conductive layer 61m, it is possible to use a material similar to that of the conductive layer of the reference electrode layer 21 in the first embodiment as an example. As a material of the resin film 40m, for example, thermoplastic resin such as polyethylene terephthalate and polypropylene can be used. Examples of the method of manufacturing the conductive film include a method of bonding the conductive layer 61m such as metal foil on the front surface of the resin film 40m, a method of forming the conductive layer 61m on the front surface of the resin film 40m by vacuum film deposition technique such as sputtering and a deposition method, and a method of forming the conductive layer 61m by applying conductive paste on the front surface of the resin film 40m by a printing method or a coating method and drying the past.

Figure 14B:
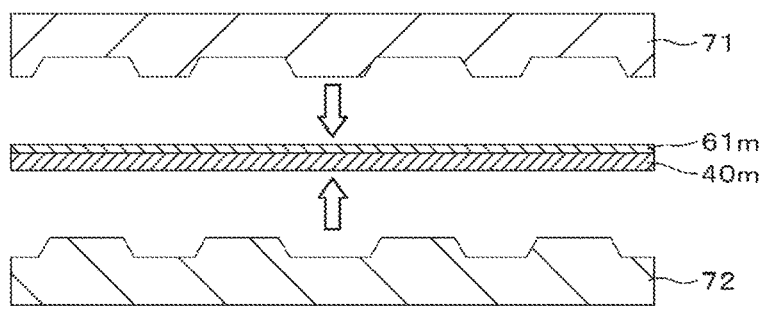
Figure 14C:
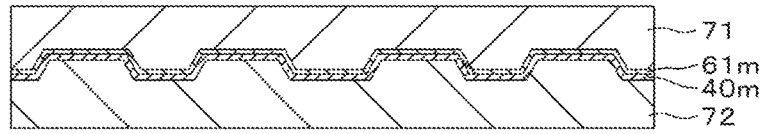
Figure 14D:
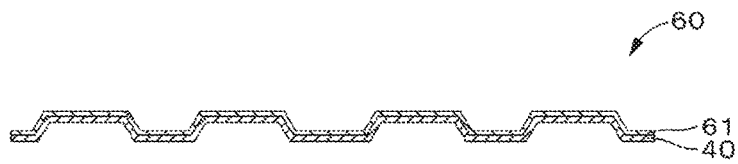

Subsequently, as shown in FIG. 14B, the conductive film is sandwiched and pressed with metal molds 71 and 72, thereby forming embossment on the conductive film as shown in FIG. 14C. Through the process as described above, as shown in FIG. 14D, it is possible to obtain the conductive embossed layer 60 as conductive embossed film.

Modified Example 2

Figure 15A:
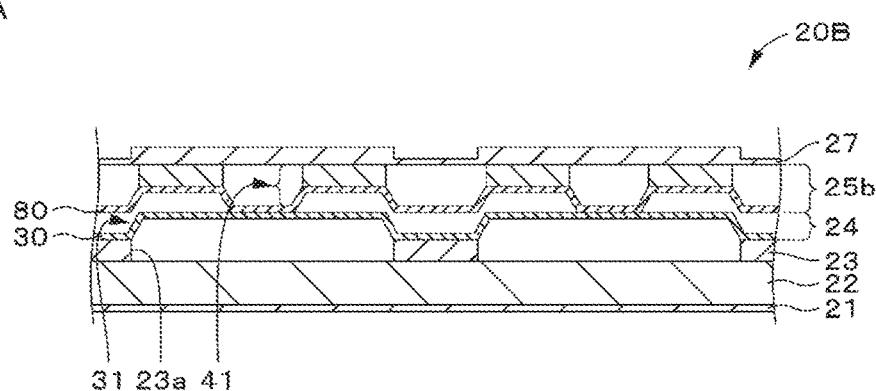
FIG. 15A is a cross-sectional view showing a first example of a configuration of a sensor module according to the modified example 2 of the first embodiment of the present technology.

As shown in FIG. 15A, a sensor module 20B according to a modified example 2 is provided with a second structure layer 25b having conductivity. The second structure layer 25b is provided with a conductive embossed layer 80 made of a conductive material. Except for this point, the sensor module 20B according to the modified example 2 is similar to the sensor module 20A according to the modified example 1.

As a material of the conductive embossed layer 80, it is possible to use a similar material as the conductive layer of the reference electrode layer 21 in the first embodiment as an example. Specifically, for example, a thin metal body capable of being subjected to press molding and a resin material having conductivity such as conductive rubber. It is desirable that the method of manufacturing the conductive embossed layer 80 be selected in accordance with characteristics of the material of the conductive embossed layer 80 such as a resin material, and for example, an injection molding method or a pressing method such as a heat pressing method.

Figure 15B:
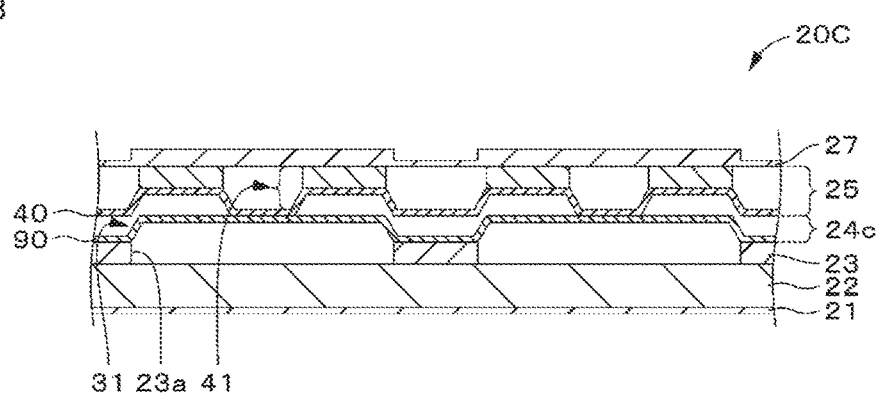
FIG. 15B is a cross-sectional view showing a second example of the configuration of the sensor module according to the modified example 2 of the first embodiment of the present technology.

In the above example, the sensor module 20B in which the second structure layer 25b has conductivity is described. However, as shown in FIG. 15B, a sensor module 20C in which a first structure layer 24c has conductivity may be provided. In this case, the first structure layer 24c may have a conductive embossed layer 90.

Modified Example 3

Figure 16A:
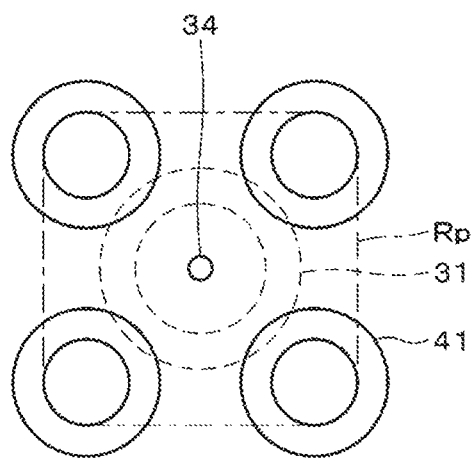
FIG. 16A is a plan view showing an example of a configuration of a sensor module according to a modified example 3 of the first embodiment of the present technology.
Figure 16B:
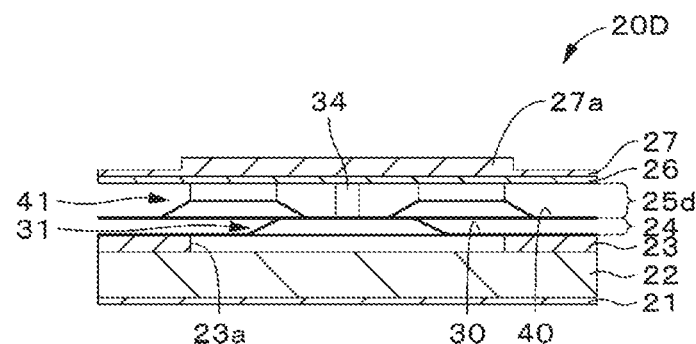
FIG. 16B is a cross-sectional view showing an example of the configuration of the sensor module according to the modified example 3 of the first embodiment of the present technology.

As shown in FIG. 16A and FIG. 16B, a sensor module 20D according to a modified example 3 is different from the sensor module 20 (see FIG. 4A) according to the first embodiment in that a pressure column 34 is further provided to a second structure layer 25d. It should be noted that in the modified example 3, parts similar to those in the first embodiment are denoted by the same symbols, and a description thereof will be omitted. For example, the pressure column 34 is disposed directly above the first structure 31. FIG. 16A and FIG. 16B show an example in which the first structure 31 and the pressure column 34 are disposed on the center of the operation area Rp.

In the sensor module 20D having the configuration described above, in the case where the center of the operation area Rp and a vicinity area thereof are pressed, it is possible to press the first structure 31 through the pressure column 34. As a result, the sense of click in the center of the operation area Rp and the vicinity area thereof can be improved.

Modified Example 4

Figure 17A:
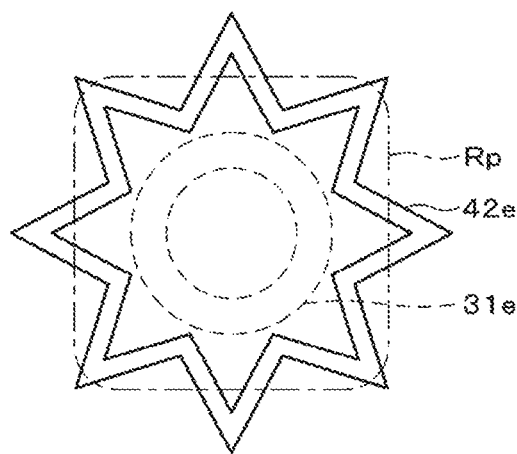
FIG. 17A is a plan view showing an example of a configuration of a sensor module according to a modified example 4 of the first embodiment of the present technology.
Figure 17B:
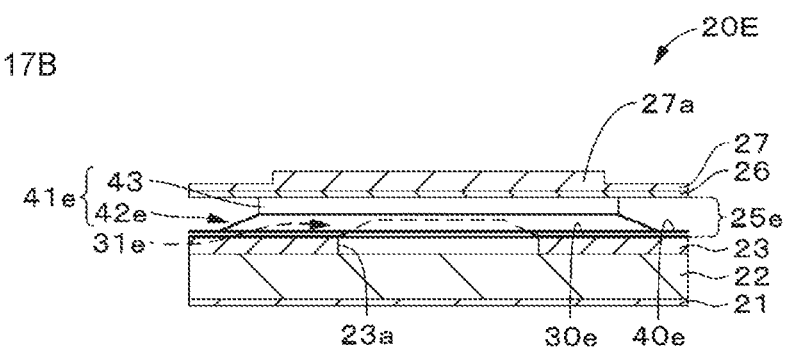
FIG. 17B is a cross-sectional view showing an example of the configuration of the sensor module according to the modified example 4 of the first embodiment of the present technology.

As shown in FIG. 17A and FIG. 17B, a sensor module 20E according to a modified example 4 is different from the sensor module 20 (see FIG. 4A) according to the first embodiment in that a structure layer 25e in which a second structure 41e is superimposed on a first structure 31e is provided. It should be noted that in the modified example 4, parts similar to those in the first embodiment are denoted by the same symbols, and a description thereof will be omitted.

The structure layer 25e is constituted of a first embossed layer 30e including a plurality of first structures 31ef, a second embossed layer 40e including a plurality of protruded portions 42e, the plurality of pressure bodies 43 respectively disposed on top portions of the plurality of protruded portions 42e. The second structure 41e is constituted of the protruded portion 42e and the pressure body 43 disposed on the top portion thereof. The protruded portion 42e is larger than the first structure 31e, and the first structure 31e is accommodated in a depressed portion on the back surface side of the protruded portion 42e. The first structure 31e is disposed on the center of the operation area Rp. The center of the second structures 41e completely or substantially coincides with the center of the operation area Rp, and the periphery thereof is positioned on the outer circumference of the key operation area Rp.

It is desirable that the protruded portion 42e have a polygonal shape when viewed from a direction vertical to the operation surface, and a plurality of corner portions of the polygonal shape be disposed at the corner portions of the key operation area Rp, respectively. This is because the sense of click at the corner portions of the key operation area Rp can be improved. As the polygonal shape of the protruded portion 42e, for example, a polygonal shape having three or more corners can be used. It should be noted that an R shape may be applied to the corner portions of the protruded portions 42e to obtain a curved surface.

In the sensor module 20E having the configuration described above, the first structure 31e contributes to the generation of click on the center of the key operation area Rp, and the second structure 41e contributes to the generation of click on the outer circumferential portion of the operation area.

Modified Example 5

Figure 18A:
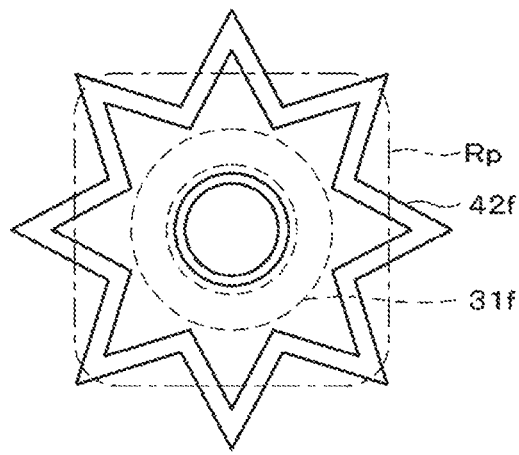
FIG. 18A is a plan view showing an example of a configuration of a sensor module according to a modified example 5 of the first embodiment of the present technology.
Figure 18B:
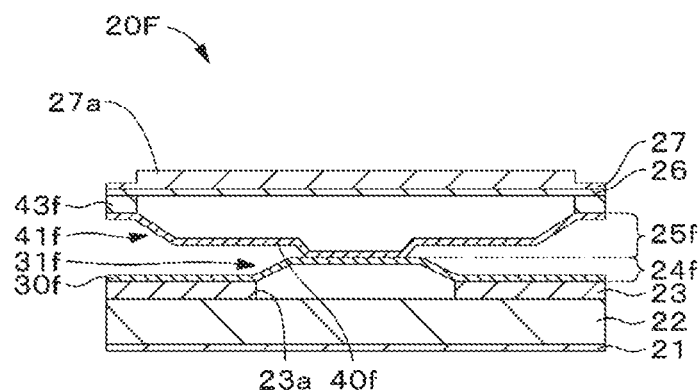
FIG. 18B is a cross-sectional view showing an example of the configuration of the sensor module according to the modified example 5 of the first embodiment of the present technology.

As shown in FIG. 18A and FIG. 18B, a sensor module 20F according to a modified example 5 is different from the sensor module 20 (see FIG. 4A) according to the first embodiment in that a top portion of a first structure 31f having a protrusion shape and a top portion of a second structure 41f having a protrusion shape are disposed so as to face each other and be put on each other. It should be noted that in the modified example 5, parts similar to those in the first embodiment are denoted by the same symbols, and a description thereof will be omitted.

A first structure layer 24f is configured by a first embossed layer 30f including the plurality of first structures 31f. The first structure 31f is protruded toward the front surface (operation surface), and the top portion thereof is disposed on the center of the key operation area Rp. A second structure layer 25f is configured by a second embossed layer 40f including a plurality of second structures 41f. The second structure 41f is protruded toward the back surface, and the top portion thereof is disposed on the center of the key operation area Rp. A bottom portion of the second structure 41f is disposed on a periphery of the key 27a or a vicinity thereof. The second structure layer 25f is bonded to the reference electrode layer 26 through a bonding layer 43f. For example, the peripheral portion of the second structure 41f and the reference electrode layer 26 are bonded through the bonding layer 43f.

Figure 19:
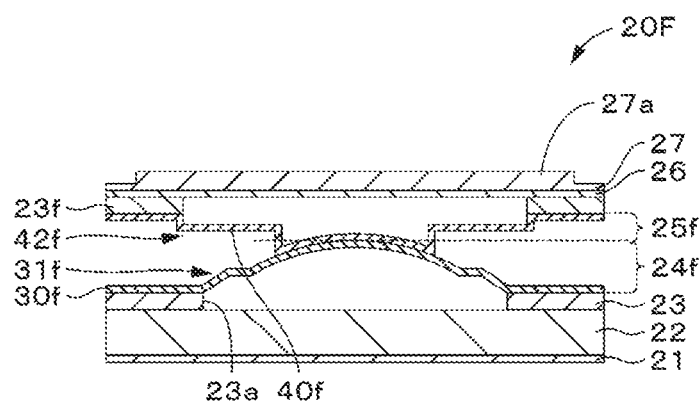
FIG. 19 is a cross-sectional view showing an example of the configuration of the sensor module according to a modified example 6 of the first embodiment of the present technology.

As shown in FIG. 18B, contact surfaces of the first and second structures 31f and 41f, that is, the top portions of the first and second structures 31f and 41f are flat surfaces, for example. It should be noted that the shape of the contact surfaces is not limited to this. As shown in FIG. 19, one of the top portions of the first and second structures 31f and 41f may have a protruded surface, and the other top portion may have a depressed surface, to place the protruded surface and the depressed surface on each other. As the shape of the protruded surface, for example, a protruded partial spherical shape can be used, and as the depressed surface, for example, a depressed partial spherical shape or the like can be used.

Figure 18C:
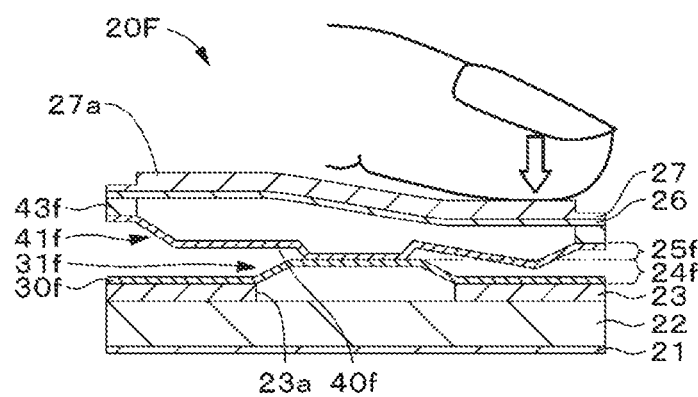
FIG. 18C is a cross-sectional view for explaining an example of an operation of the sensor module at a time when the peripheral portion of the key is pressed to perform the key input operation.

In the sensor module 20F having the configuration described above, as shown in FIG. 18C, when the outer circumferential portion of the key operation area Rp is pressed, the pressing force is transmitted from the top portion of the second structure 41f to the top portion of first structure 31f. It is desirable that the second structure 42f have a polygonal shape when viewed from a direction vertical to the operation surface, and a plurality of corner portions included in the polygonal shape be disposed at the corner portions of the key operation area Rp, respectively. This is because pressing forces at the corner portions can be concentrated on the center, and thus the sense of click can be improved. As the polygonal shape of the second structures 41f, for example, a polygonal shape having three or more corners can be used. It should be noted that an R shape may be applied to the corner portions of the second structure 41f to obtain a curved surface.

Modified Example 6

Figure 20:
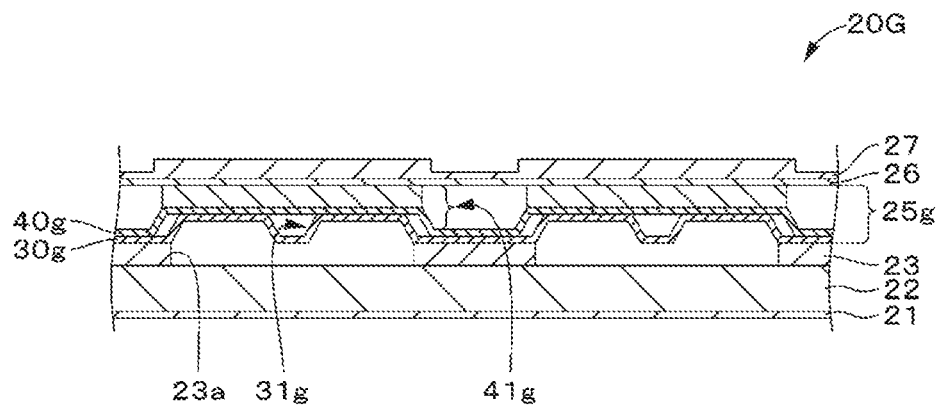
FIG. 20 is a cross-sectional view showing an example of the configuration of the sensor module according to a modified example 7 of the first embodiment of the present technology.

As shown in FIG. 20, a sensor module 20G according to a modified example 6 is different from the sensor module 20 (see FIG. 4A) according to the first embodiment in that first embossed layers 30g and 40g are laminated in such a manner that one second structure 41g accommodates a plurality of first structures 31g. It should be noted that in the modified example 6, parts similar to those in the first embodiment are denoted by the same symbols, and a description thereof will be omitted.

The second structure 41g has a depressed portion on a back surface side thereof, and in the depressed portion, the plurality of first structures 31g is accommodated. The plurality of first structures 31g is disposed on the periphery of the operation area, for example, on the corner portions of the operation area.

Modified Example 7

In the first embodiment described above, as shown in FIG. 4A and FIG. 4B, the description is given on the configuration in which the second structure 41 is provided with the pressure body 43 on the top portion 42a of the protruded portion 42 as an example. However, the configuration of the second structure 41 is not limited to this example. Hereinafter, a description will be given on an example in which the stiffness of the top portion 42a of the protruded portion 42 is increased, with the result that the sense of click can be improved, and an operation load can be increased.

Figure 30A:
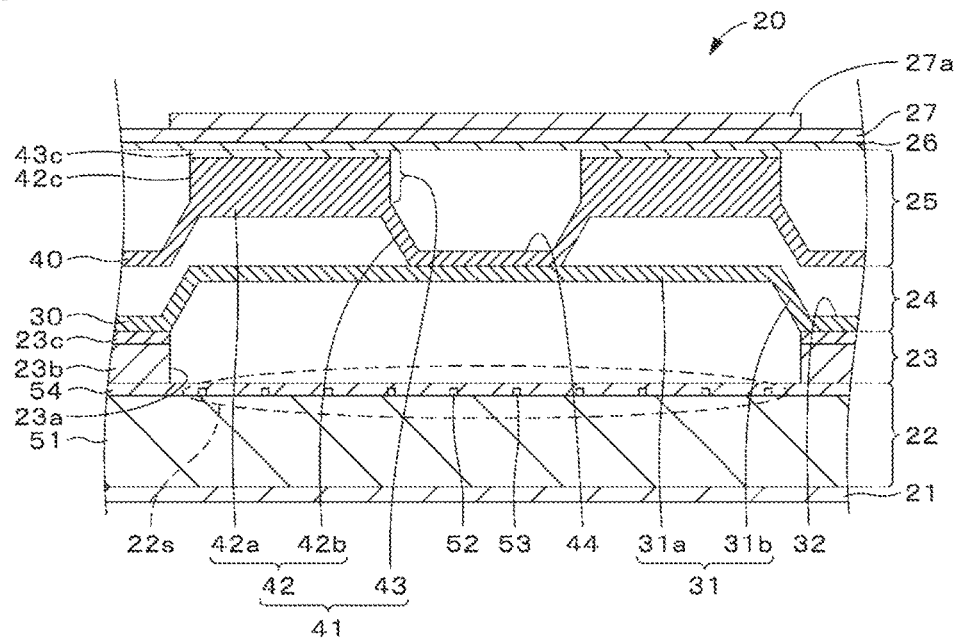
FIG. 30A and FIG. 30B each are a cross-sectional view showing an example of a configuration of a sensor module according to the modified example 7 of the first embodiment of the present technology.

As shown in FIG. 30A, a thick film portion 42c obtained by increasing the thickness of the top portion 42a of the protruded portion 42 as compared to the thickness of the buckling portion 42b may be provided. The thick film portion 42c is bonded to the reference electrode layer 26 through the adhesive layer 43c. In this case, the thick film portion 42c and the adhesive layer 43c constitute the pressure body 43. In the configuration described above, as the second embossed layer 40, for example, such an embossed film that a part corresponding to the top portion 42a is thicker than a remaining part is used. The embossed film can be formed by melt molding, for example.

Figure 30B:
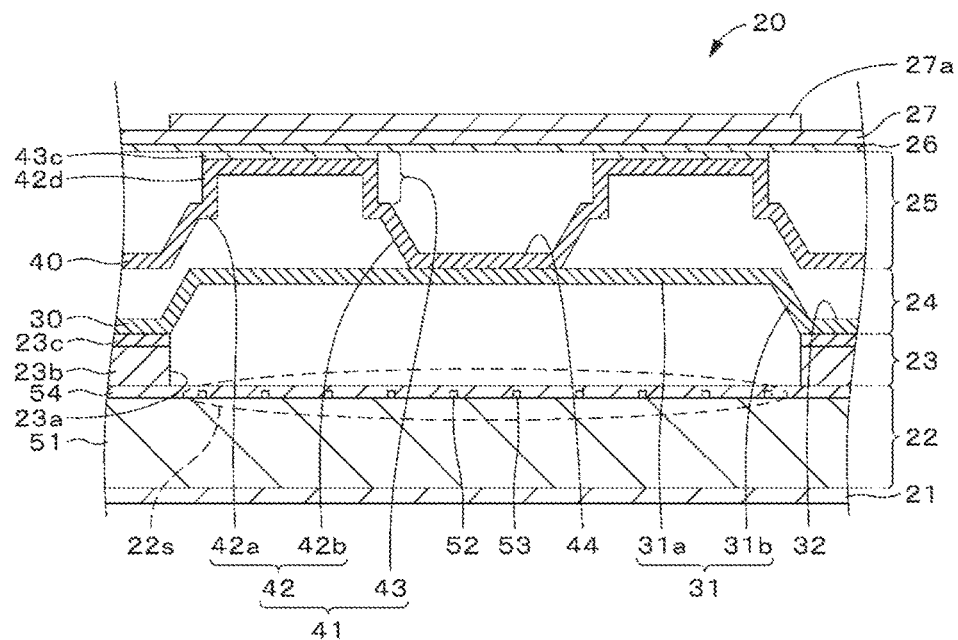

As shown in FIG. 30B, the protruded portion 42 may be provided with a shaped portion 42d obtained by deforming the top portion 42a thereof into a protrusion shape. The shaped portion 42d is bonded to the reference electrode layer 26 through the adhesive layer 43c. In this case, the shaped portion 42d and the adhesive layer 43c constitute the pressure body 43. In the configuration described above, it is desirable that the shape of the protruded portion 42 be a conical frustum shape. As the shape of the shaped portion 42d, for example, a shape obtained by partially or entirely uniformly protruding the top portion 42a of the protruded portion 42 or a shape obtained by depressing the center of the shape can be used. From a viewpoint of an improvement of the sense of click, the former shape is desirable. More specifically, as the shape of the shaped portion 42d, a columnar shape such as a cylindrical shape and a polygonal columnar shape or a shape obtained by depressing the center of those can be used. From a viewpoint of an improvement of the sense of click, the columnar shape such as a cylindrical shape and a polygonal column is desirable. It is desirable that the shaped portion 42d be formed by embossing at the same time when forming the protruded portions 42.

If the stiffness of the top portion 42a of the protruded portion 42 is small, deformation may occur at that portion, which hinders stress concentration on a part which is desired to be clicked. As a result, there is a fear that it may be impossible to obtain a clear click. When a stiff, thick material is bonded onto the top portion 42a of the protruded portion 42 to form the pressure body 43, an improvement of tactile impression may be obtained, but this configuration may cause an increase in cost. In contrast, in the case where the shaped portion 42d is formed onto the top portion 42a of the protruded portion 42 by molding to increase the stiffness, it is possible to improve the tactile impression without causing an increase in cost.

In the first embodiment, the resin layer 43a may be made of a material having high stiffness, for example, a material having higher stiffness than the material of the second embossed layer 40.

Modified Example 8

Figure 31A:
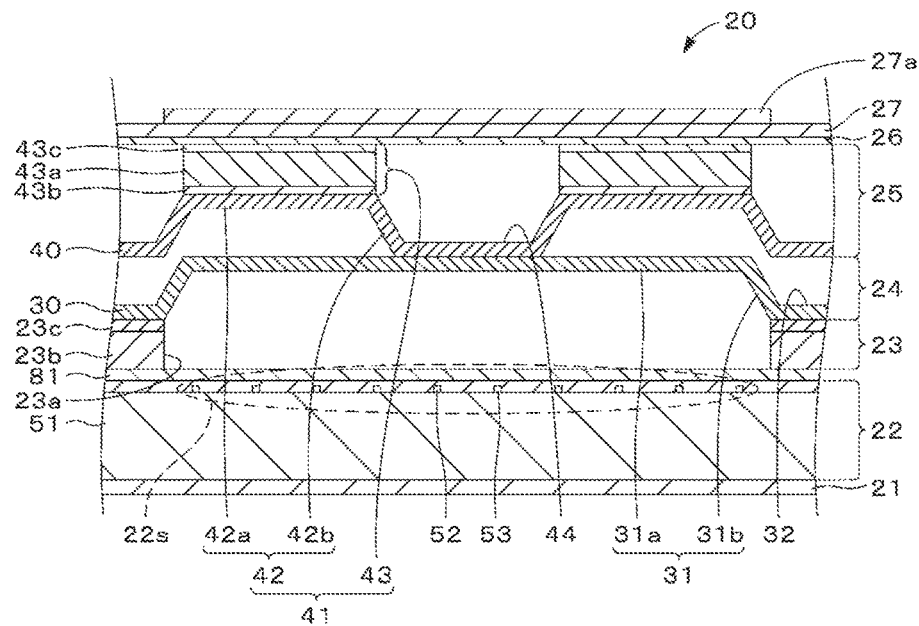
FIG. 31A is a cross-sectional view showing an example of a configuration of a sensor module according to a modified example 8 of the first embodiment of the present technology.

As shown in FIG. 31A, the sensor module 20 may be further provided with a base layer 81 disposed between the sensor layer 22 and the intermediate layer 23. The base layer 81 is not bonded onto the sensor layer 22 as a lower layer thereof by an adhesive layer or the like, but is only placed thereon. Further, the base layer 81 has the same or substantially the same linear expansion coefficient as the first and second embossed layers 30 and 40. The base layer 81 and the first and second embossed layers 30 and 40 may be made of the same material or different materials having the same or substantially the same linear expansion coefficient. It should be noted that in the case where the second embossed layer 40 is not bonded to the first embossed layer 30 but only placed thereon, the base layer 81 may have the same or substantially the same linear expansion coefficient as the first embossed layer 30 and may have a different linear expansion coefficient from the second embossed layer 40.

The base layer 81 is a film, and on a front surface of the film, the intermediate layer 23 is directly provided. As a material of the film, it is possible to use a material similar to that of the first and second embossed layers 30 and 40. It should be noted that the base layer 81 may be a one-side adhesive film provided with a resin layer as a film and an adhesive layer disposed on a front surface of the resin layer, and through the adhesive layer, the base layer 81 and the intermediate layer 23 may be bonded to each other. In this case, the linear expansion coefficient of the base layer 81 means a linear expansion coefficient of the resin layer as the film.

In the sensor module 20 according to the modified example 8, the base layer 81 having the configuration described above is further provided between the sensor layer 22 and the intermediate layer 23. Thus, even in the case where the sensor layer 22 and the first and second embossed layers 30 and 40 are extended or contracted due to a change in environmental temperature or the like in an in-plane direction of the sensor layer 22, it is possible to suppress the generation of distortion or the like in members that constitute the sensor module 20. Accordingly, it is possible to increase the reliability of the sensor module 20.

Modified Example 9

Figure 31B:
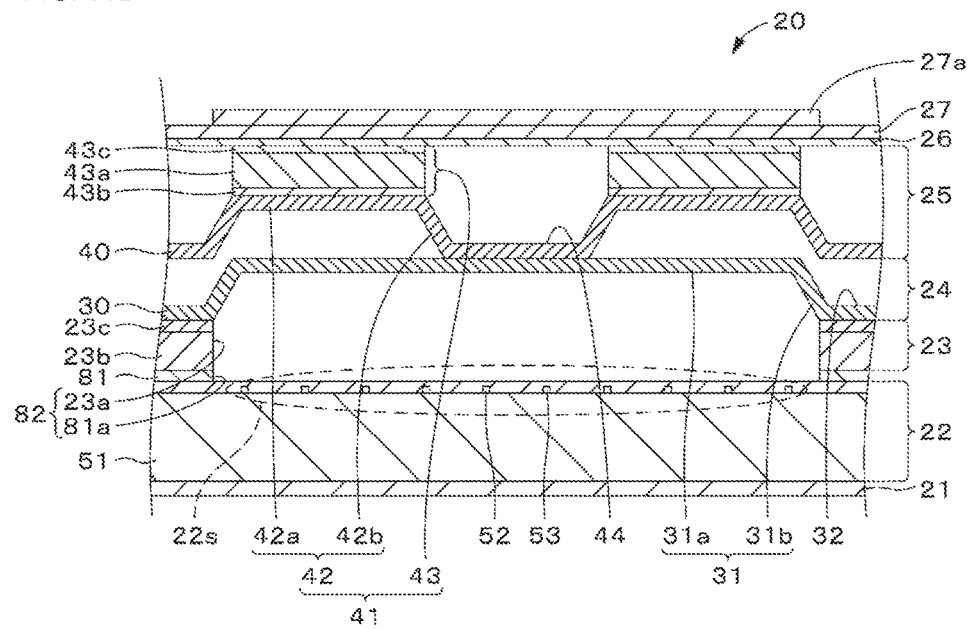
FIG. 31B is a cross-sectional view showing an example of a configuration of a sensor module according to a modified example 9 of the first embodiment of the present technology.

As shown in FIG. 31B, the base layer 81 may include a plurality of hole portions 81a. The hole portions 81a are through holes that penetrate the base layer 81 from the front surface thereof to the back surface thereof. The plurality of hole portions 81a is directly below the first structure 31. That is, when viewed in a direction vertical to the front surface (operation surface) of the sensor module 20, the hole portions 23a and 81a are formed on a superposed position. The hole portion 81a of the base layer 81 and the hole portion 23a of the intermediate layer 23 constitute one hole portion 82. Accordingly, in the case where the key input operation is performed, the top portion 31a of the first structure 31 is inverted and thus can enter the hole portion 82. It should be noted that the hole portions 23a and 81a only have to allow the top portion 31a of the first structure 31 to be inverted and enter the hole portions as described above, and may not have the same shape and size.

In the sensor module 20 in the modified example 9, in the base layer 81, the plurality of hole portions 81a is provided, and the hole portion 81a of the base layer 81 and the hole portion 23a of the intermediate layer 23 constitute the one hole portion 82. Thus, it is possible to improve the sense of stroke, that is, the sense of typing without increasing a total thickness of the sensor module 20 due to providing of the base layer 81.

It should be noted that the main body layer 23b of the intermediate layer 23 may be configured by a film similar to the base layer 81. In this case, it is possible to obtain a similar effect as above without providing the base layer 81.

Modified Example 10

In the first embodiment, the base material 51 (see FIG. 4B and FIG. 6B) included in the sensor layer 22 may have the same or substantially the same linear expansion coefficient as the first and second embossed layers 30 and 40. In this case, it is possible to increase the reliability of the sensor module 20 as in the modified example 9.

Modified Example 11

Figure 32A:
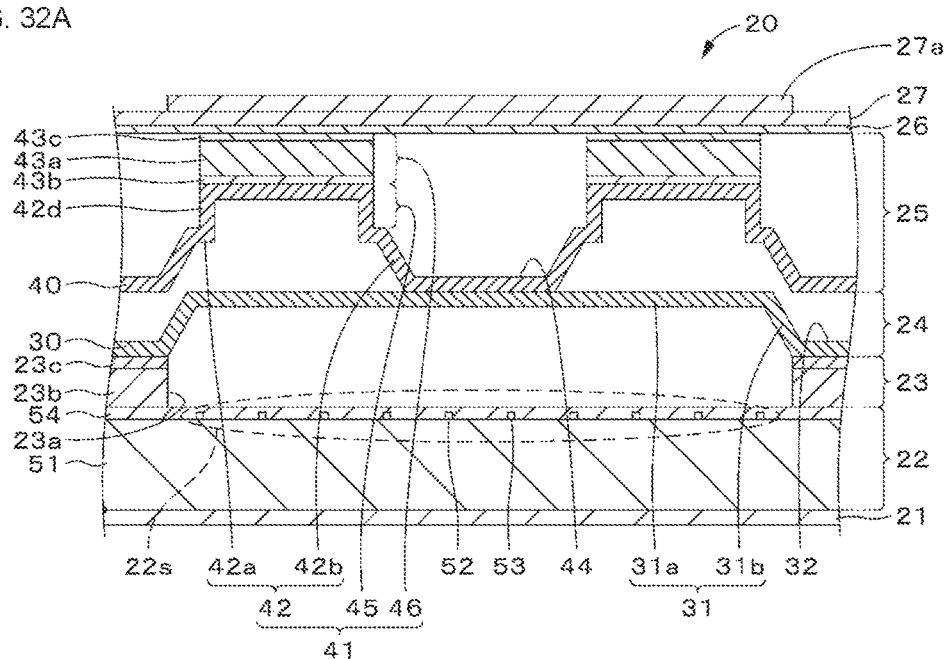
FIG. 32A is a cross-sectional view showing an example of a configuration of a sensor module according to a modified example 11 of the first embodiment of the present technology.

As shown in FIG. 32A, the second structure 41 may be provided with two pressure bodies 45 and 46 on the top portion 42a of the protruded portion 42. The pressure body 46 as a second pressure body is disposed on the pressure body 45 as a first pressure body.

The pressure body 45 is the shaped portion 42d, for example. The pressure body 46 is an adhesive film, for example. For example, the adhesive film is a two-sided adhesive film provided with the resin layer 43a as the film and the adhesive layers 43b and 43c provided on both sides of the resin layer, respectively. The pressure body 46 is bonded on the front surface of the top portion of the shaped portion 42d through the adhesive layer 43b and is bonded on the back surface of the reference electrode layer 26 through the adhesive layer 43c. The pressure body 46 has the same or substantially the same size as the pressure body 45, for example.

In the sensor module 20 in the modified example 11, the two pressure bodies 45 and 46 are provided, so a click rate is improved. Further, the following effect can be obtained. The second embossed layer 40 and the key top layer 27 are separated by a sufficient distance. Therefore, when the key 27a is pressed, it is possible to suppress the second embossed layer 40 and the key top layer 27 from being in contact. It is possible to suppress the deformation of the key 27a. The elasticity of the key 27a by a deformation amount is not added, so the click rate is improved. A horizontal movement of the key 27a is obtained, with the result that a good feel can be obtained.

It should be noted that in the modified example 11 described above, the description is given on the case where the pressure body 45 as the first pressure body is the shaped portion 42d as an example. However, the pressure body 45 may be an adhesive film. The adhesive film is, for example, a one-side adhesive film provided with a resin layer as a film and an adhesive layer disposed on a back surface of the resin layer.

Modified Example 12

Figure 32B:
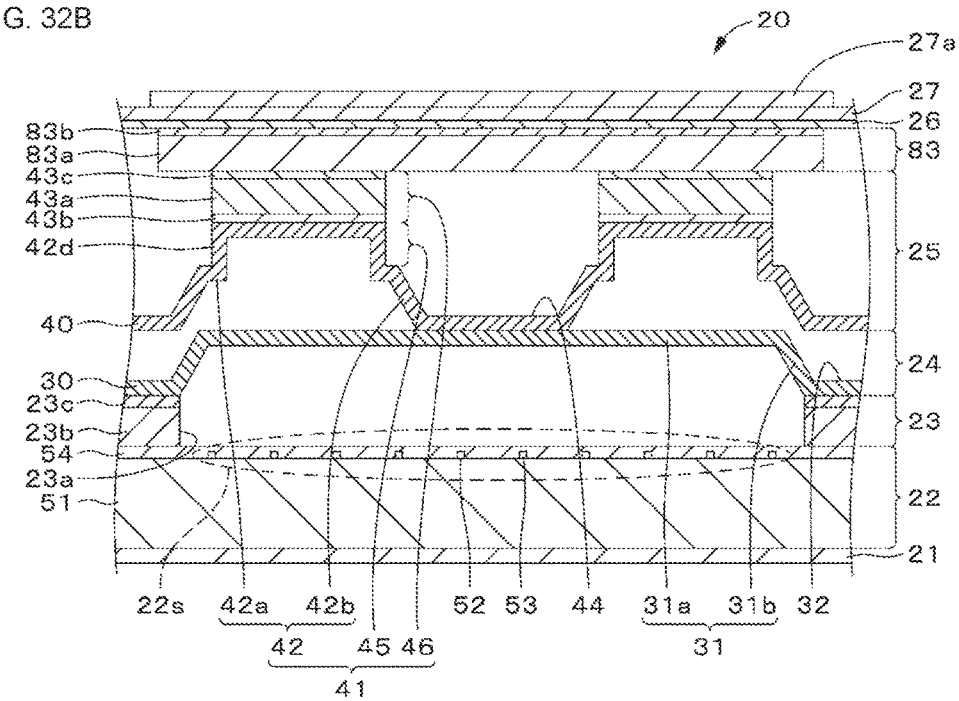
FIG. 32B is a cross-sectional view showing an example of a configuration of a sensor module according to a modified example 12 of the first embodiment of the present technology.

As shown in FIG. 32B, the sensor module 20 may be further provided with a support layer 83 disposed between the reference electrode layer 26 and the plurality of second structures 41 included in the key operation area Rp. By using this configuration, it is possible to suppress a gritty feel of the second structures 41 through the key top layer 27 when the front surface of the key top layer 27 is touched with a finger or the like.

It is desirable that the periphery of the support layer 83 be disposed on an inner side from the periphery of the key 27a, when viewed from a direction vertical to the front surface (operation surface) of the sensor module 20. For example, the periphery of the support layer 83 is disposed so as to be superposed or substantially superposed on the periphery of the key 27a. By disposing the periphery of the support layer 83 on such a position, it is possible to further suppress the gritty feel of the second structures 41 through the key top layer 27.

The support layer 83 is an adhesive film, for example. The adhesive film is a one-side adhesive film provided with a resin layer 83a as a film and an adhesive layer 83b provided on a front surface of the resin layer 83a. The support layer 83 is bonded on the back surface of the reference electrode layer 26 through the adhesive layer 83b. The pressure body 46 is bonded on the back surface of the support layer 83 through the adhesive layer 43c.

It should be noted that in the modified example 12, the description is given on the configuration in which the support layer 83 and the pressure body 46 are separated bodies as an example. However, the support layer 83 and the pressure body 46 may be integrally formed.

Modified Example 13

Figure 33A:
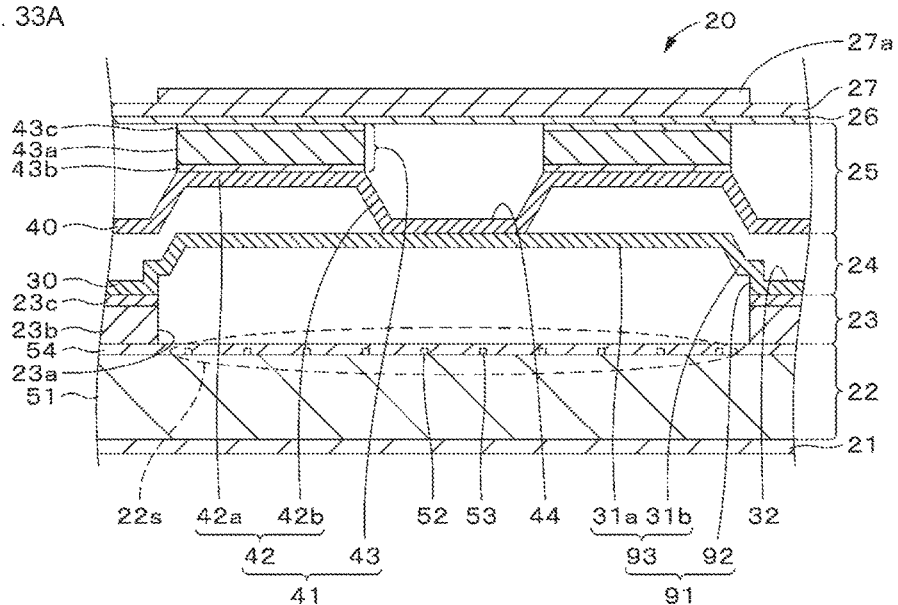
FIG. 33A is a cross-sectional view showing an example of a configuration of a sensor module according to a modified example 13 of the first embodiment of the present technology.

As shown in FIG. 33A, a first structure 91 may be provided with a base portion 92 having a side surface that is erected substantially vertically to the front surface of the intermediate layer 23 or a side surface that is tilted at a tilt angle of less than 90 degrees with respect to the front surface of the intermediate layer 23 and may be provided with a protruded portion 93 disposed on the base portion 92. More specifically, the first structure 91 may be provided with the base portion 92 having a side surface that is erected substantially vertically to the front surface of the intermediate layer 23 or a side surface that is tilted at a tilt angle of less than 90 degrees with respect to the front surface of the intermediate layer 23 and having a square outer circumference, and may be provided with the protruded portion 93 that is disposed on the base portion 92 and has a conical frustum shape. As a result, deformation can be generated at corner portions of the base portion 92, so the sense of click is improved. It is desirable that the outer circumference of the protruded portion 93 on a bottom side be substantially in contact with the outer circumference of the base portion 92. This is because the sense of click is further improved.

Modified Example 14

Figure 33B:
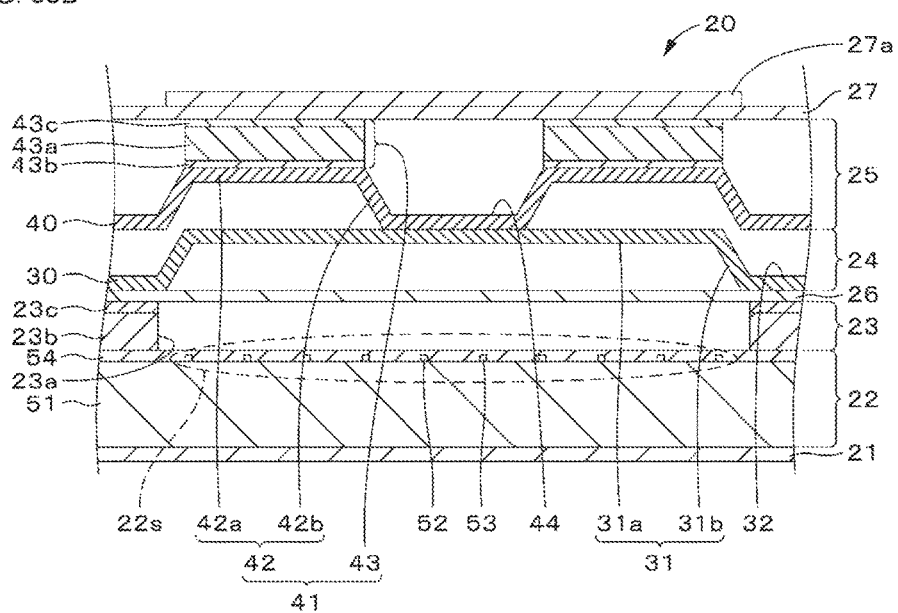
FIG. 33B is a cross-sectional view showing an example of a configuration of a sensor module according to a modified example 14 of the first embodiment of the present technology.

As shown in FIG. 33B, the reference electrode layer 26 disposed between the intermediate layer 23 and the first structure layer 24 may be further provided. The bottom portion of the first structure 31 is disposed on an inner side of the hole portion 23a of the intermediate layer 23, when viewed in a direction vertical to the front surface (operation surface) of the sensor module 20. More specifically, a lower portion of the buckling portion 31b of the first structure 31 is disposed on the inner side of the outer circumference of the hole portion 23a.

When the gesture input operation is performed for the front surface (operation surface) of the sensor module 20, the reference electrode layer 26 is pressed by the lower portion of the buckling portion 31b of the first structure 31, and a part positioned above the hole portion 23a in the reference electrode layer 26 is slightly depressed into the hole portion 23a of the intermediate layer 23. As a result, the distance between the sensor layer 22 and the reference electrode layer 26 is slightly changed, and the capacitance between the unit electrode bodies 52m and 53m is slightly changed. By the detection units 22s in the sensor layer 22, the electrostatic capacitance change is detected and output to the controller IC 14 as the electrical signal.

When the key input operation is performed for the front surface (operation surface) of the sensor module 20, the first structure 31 is inverted, and the reference electrode layer 26 is pressed to the top portion 31a thereof. A part positioned above the hole portion 23a in the reference electrode layer 26 is depressed into the hole portion 23a of the intermediate layer 23. At this time, the top portion 31a of the inverted first structure 31 may also be depressed into the hole portion 23a of the intermediate layer 23. As a result, the distance between the sensor layer 22 and the reference electrode layer 26 is largely changed, and the capacitance between the unit electrode bodies 52m and 53m is largely changed. By the detection units 22s in the sensor layer 22, the electrostatic capacitance change is detected and output to the controller IC 14 as the electrical signal.

In the sensor module 20 according to the first embodiment, the distance between the sensor layer 22 and the reference electrode layer 26 is demanded to be constant, so it is desirable to perform gap restriction in terms of a process. On the other hand, in the sensor module 20 according to the modified example 14, it is only necessary to bond the first and second structure layers 24 and 25 or the like on the reference electrode layer 26, so the gap restriction is unnecessary to make the process simple.

Modified Example 15

Figure 34:
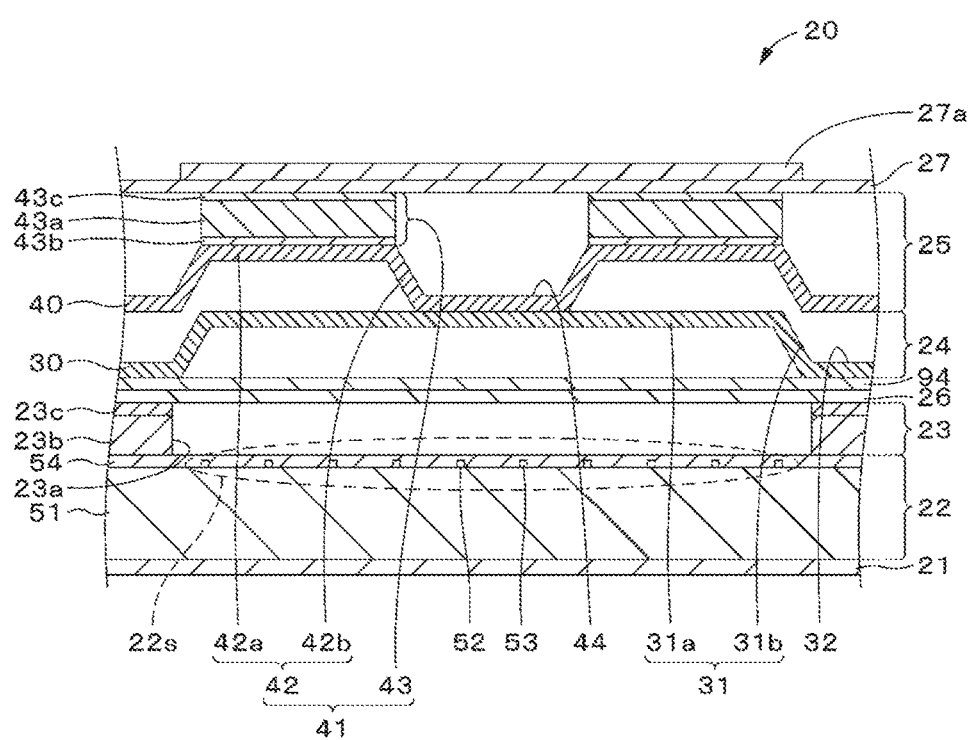
FIG. 34 is a cross-sectional view showing an example of a configuration of a sensor module according to a modified example 15 of the first embodiment of the present technology.

As shown in FIG. 34, the sensor module 20 may be provided with a base layer 94 between the reference electrode layer 26 and first structure layer 24. The base layer 94 is not bonded onto the reference electrode layer 26 as a lower layer thereof with an adhesive layer or the like, but is only placed thereon. The first structure layer 24 is bonded onto the base layer 94 with an adhesive layer or the like.

In the sensor module 20 in the modified example 15, the base layer 94 is further provided between the reference electrode layer 26 and first structure layer 24. Therefore, even in the case where the sensor layer 22 and the first structure layer 24 are extended or contracted in an in-plane direction of the sensor layer 22 due to a change in environmental temperature or the like, it is possible to suppress the generation of distortion or the like in members that constitute the sensor module 20. Accordingly, it is possible to improve the reliability of the sensor module 20. The base layer 94 is similar to the base layer 81 in the modified example 8 described above.

Modified Example 16

In the modified example 14, in the case where the reference electrode layer 26 is a conductive base material provided with a base material including polymer resin and a conductive layer disposed on the base material, the base material may have the same or substantially the same linear expansion coefficient as the first and second embossed layers 30 and 40. In this case, it is also possible to increase the reliability of the sensor module 20 as in the modified example 15.

Further, in the case where the reference electrode layer 26 is a conductive base material including a conductive material and polymer resin, the base material may have the same or substantially the same linear expansion coefficient as the first and second embossed layers 30 and 40. In this case, it is also possible to increase the reliability of the sensor module 20 as in the modified example 15.

2. Second Embodiment

[2.1 Outline]

In the first embodiment, the description is given on the sensor module which is provided with a structure layer with laminated structure of two or more layers, and in which two or more structures are disposed with respect to the operation area corresponding to the key, and the two or more structures are disposed in two or more separated layers. In contrast, in the second embodiment, a description will be given on a sensor module which is provided with a structure layer with a single layer structure, and in which two or more structures are disposed with respect to the operation area corresponding to the key, and the two or more structures are disposed in an in-plane direction of the sensor layer.

[2.2 Configuration of Sensor Module]

Figure 21A:
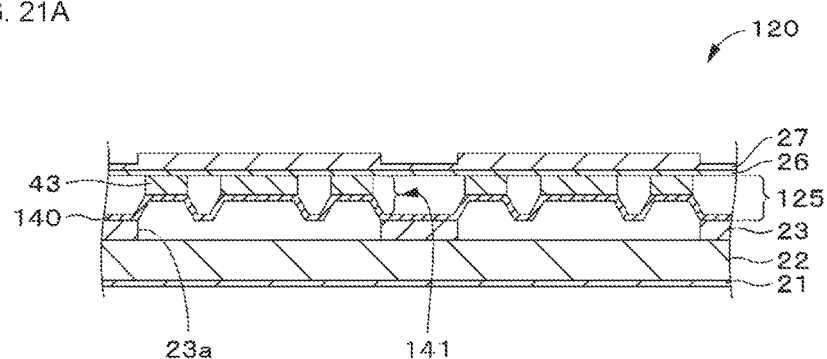
FIG. 21A is a cross-sectional view showing an example of the configuration of a sensor module according to a second embodiment of the present technology.
Figure 21B:
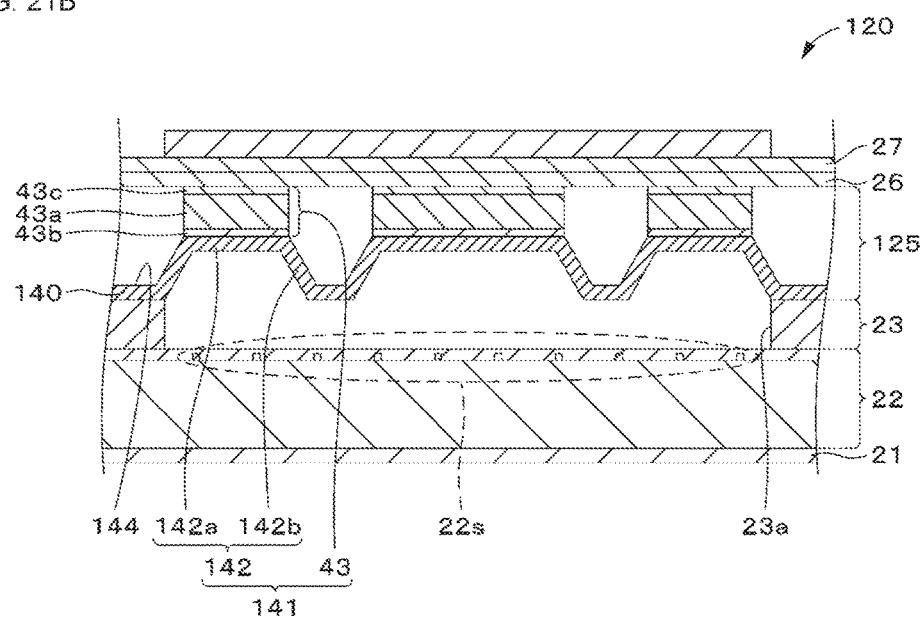
FIG. 21B is a cross-sectional view showing a part of the sensor module shown in FIG. 21A in an enlarged manner.

As shown in FIG. 21A and FIG. 21B, a sensor module 120 according to the second embodiment is different from the sensor module 20 (see FIG. 4A) according to the first embodiment in that a structure layer 125 with a single layer is disposed between the intermediate layer 23 and the reference electrode layer 26. It should be noted that in second embodiment, parts similar to those in the first embodiment are denoted by the same symbols, and a description thereof will be omitted.

A plurality of structures 141 included in the structure layer 125 separates the intermediate layer 23 and the reference electrode layer 26, and a predetermined space is provided. The structure layer 125 is constituted of an embossed layer (uneven layer) 140 having an uneven shape and the plurality of pressure bodies 43 disposed on top portions 142a of a plurality of protruded portions 142 of the embossed layer 140. The structure 141 is constituted of the protruded portion 142 and the pressure body 43 disposed on the top portion 142a of the protruded portion 142. A back surface side of the protruded portion 142 is depressed, and an inside of the protruded portion 142 is hollow. Between the protruded portions, a flat portion 144 is provided, and the flat portion 144 is fixed by being bonded to the intermediate layer 23, for example.

The protruded portion 142 is a reaction force structure, the reaction force of which is nonlinearly changed with respect to a pressing amount (with respect to an operation load). The protruded portion 142 is provided with the top portion 142a and a buckling portion 142b. It is desirable that the shape of the protruded portion 142 be a conical frustum or a pyramid frustum. By having such a shape, it is possible to suppress a height thereof as compared to the case of having a dome shape. It should be noted that the shape of the protruded portion 142 is not limited to this, and another shape can be user.

By being inverted, an abrupt change in reaction force is caused for the protruded portion 142. In order to invert the protruded portion 142 with the embossed layer 140 fixed to the intermediate layer 23, that is, vertically switch a positional relationship between the top portion 142a of the protruded portion 142 and a bottom portion thereof, it is desirable that the hole portions 23a have a depth to some extent. It is desirable that the thickness of the pressure body 43 be equal to or more than the thickness of the intermediate layer 23, that is, the depth of the hole portion 23a. This is because the sense of click is improved. Further, it is desirable that the depth of the hole portion 23a be equal to or less than the height of the protruded portion 142. This is because there is a fear that the protruded portion 142 may not be returned after being inverted, if the depth of the hole portion 23a exceeds the height of the protruded portion 142.

(Arrangement of Structures)

The key operation area Rp corresponding to the key 27a includes the two or more structures 141. The two or more structures 141 are arranged in the in-plane direction of the sensor layer 22. The two or more structures 141 are disposed on such positions as to be symmetrical with respect to a straight line that links midpoints of opposite sides of the key operation area Rp, for example. Examples of the arrangement positions of the structures 141 include the center of the key operation area Rp, the corners of the key operation area Rp, the midpoints of sides of the key operation area Rp, and a combination of two or more of those.

Examples of an arrangement form of the structures 141 include an arrangement form in which four or more structures 141 are arranged on the periphery of the key operation area Rp and an arrangement form in which four or more structures 141 are arranged on the periphery of the key operation area Rp, and one structure 141 is disposed on the center of the key operation area Rp. More specifically, examples of the arrangement form include an arrangement form in which four structures 141 are arranged at the corners of the rectangular key operation area Rp, the four structures 141 are arranged at the corners of the rectangular key operation area Rp, and the one structure 141 is disposed on the center of the key operation area Rp, an arrangement form in which the four structures 141 are arranged at midpoints of the respective sides of the rectangular key operation area Rp, and an arrangement form in which the four structures 141 are arranged on the midpoints of the respective sides of the rectangular key operation area Rp, and the one structure 141 is disposed on the center of the key operation area Rp.

Figure 22A:
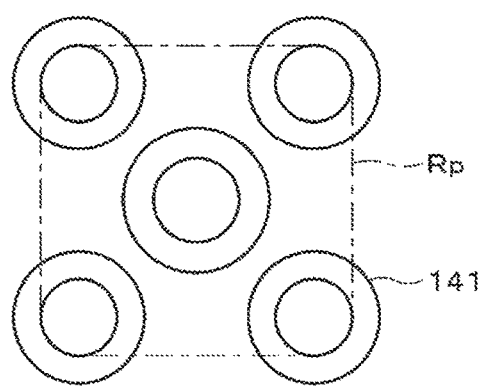
FIG. 22A is a plan view showing a first example of a disposition of a structure.
Figure 22B:
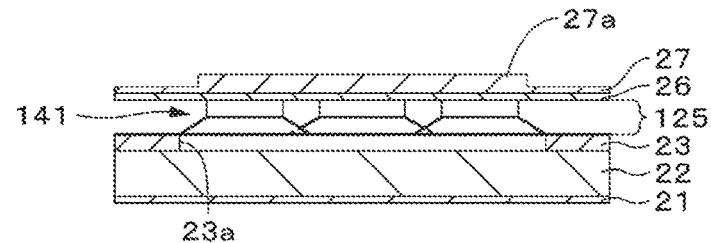
FIG. 22B is a cross-sectional view showing the first example of the disposition of the structure.

FIG. 22A and FIG. 22B show an example in which five structures 141 are arranged in the operation area Rp. The one structure 141 is disposed on the center of the rectangular key operation area Rp, and the four structures 141 are arranged at the corners of the rectangular key operation area Rp, respectively. It is possible to generate the sense of click on each of substantially center portions of the structures 141.

Figure 23A:
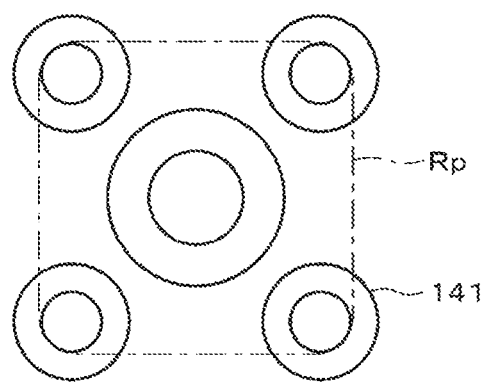
FIG. 23A is a plan view showing a second example of the disposition of the structure.
Figure 23B:
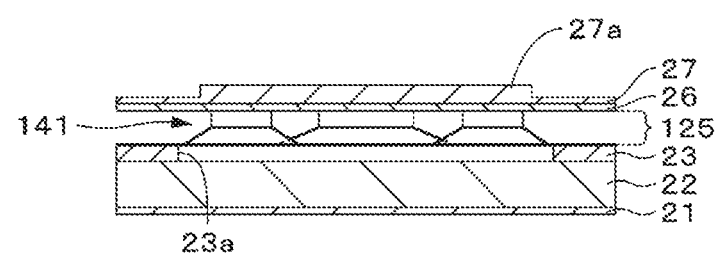
FIG. 23B is a cross-sectional view showing the second example of the disposition of the structure.
Figure 24A:
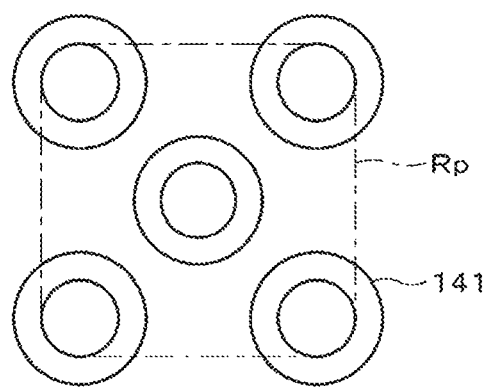
FIG. 24A is a plan view showing a third example of the disposition of the structure.
Figure 24B:
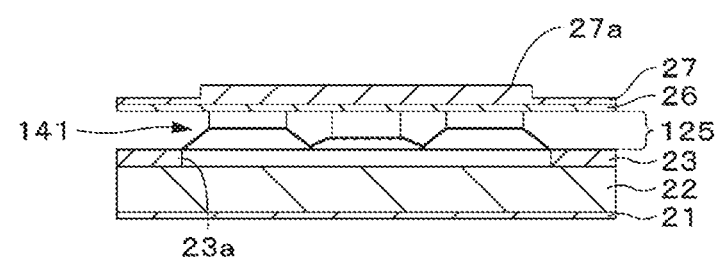
FIG. 24B is a cross-sectional view showing the third example of the disposition of the structure.
Figure 25A:
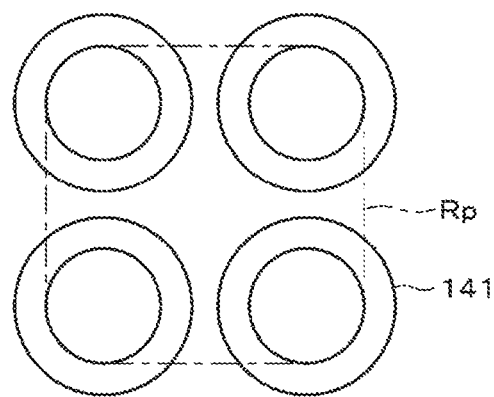
FIG. 25A is a plan view showing a fourth example of the disposition of the structure.
Figure 25B:
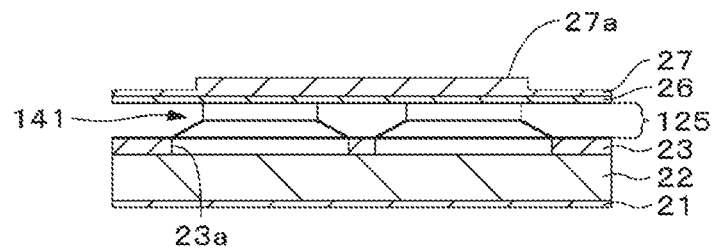
FIG. 25B is a cross-sectional view showing the fourth example of the disposition of the structure.

As shown in FIG. 23A and FIG. 23B, the plurality of structures 141 arranged in the operation area Rp may have different sizes. Further, as shown in FIG. 24A and FIG. 24B, the plurality of structures 141 arranged in the operation area Rp may have different heights. Further, as shown in FIG. 25A and FIG. 25B, the structure 141 may not be disposed on the center of the operation area Rp, and the structures 141 may be disposed only on the peripheral portion of the operation area Rp, for example, at the respective corners.

[2.3 Operation of Sensor Module]

Hereinafter, with reference to FIG. 26A to FIG. 27C, a description will be given on an example of an operation of the sensor module 120 at the time when gesture and key input operations are performed.

(Gesture Input Operation)

Figure 27A:
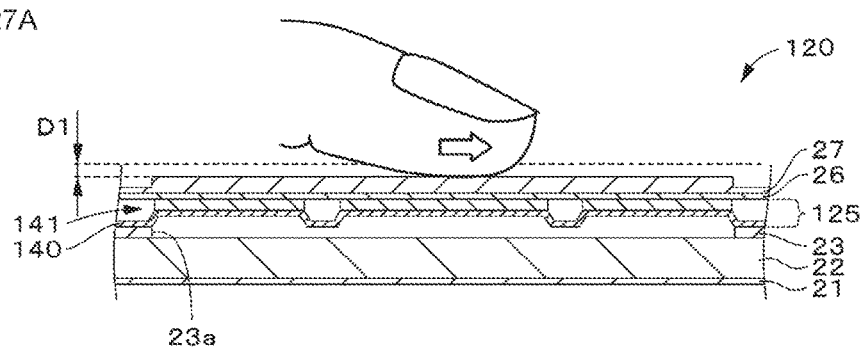
FIG. 27A is a cross-sectional view for explaining an example of an operation of a sensor module at a time when a gesture input operation is performed.

When a gesture input operation is performed for the front surface (operation surface) of the sensor module 120, as shown in FIG. 27A, the shape of the structure 141 is slightly deformed, and the structure 141 is shifted downwards from an initial position by the distance D1. As a result, the distance between the sensor layer 22 and the reference electrode layer 26 is slightly changed by the distance D1, and the capacitance between the unit electrode bodies 52m and 53m is slightly changed. By the detection units 22s in the sensor layer 22, the electrostatic capacitance change is detected and output to the controller IC 14 as the electrical signal.

(Key Input Operation)

Figure 26A:
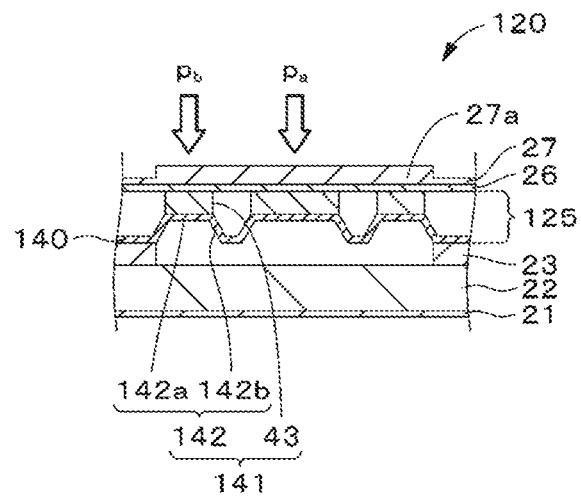
FIG. 26A is a cross-sectional view for explaining an example of a pressed position of a key at a time of a key input operation.
Figure 26B:
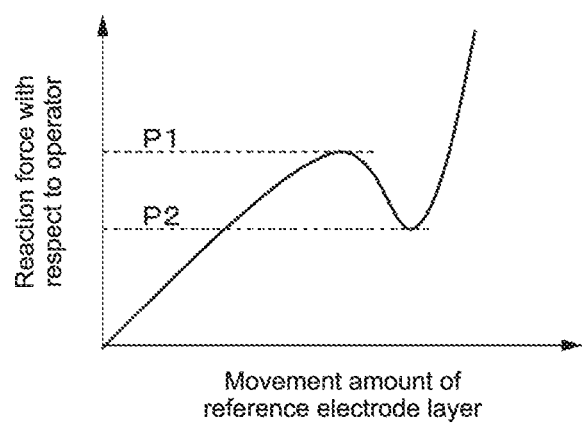
FIG. 26B is a graph showing an example of a relationship between a movement amount of a reference electrode and a reaction force to an operator at a time when at a time when the center of a key is pressed to perform a key input operation.
Figure 26C:
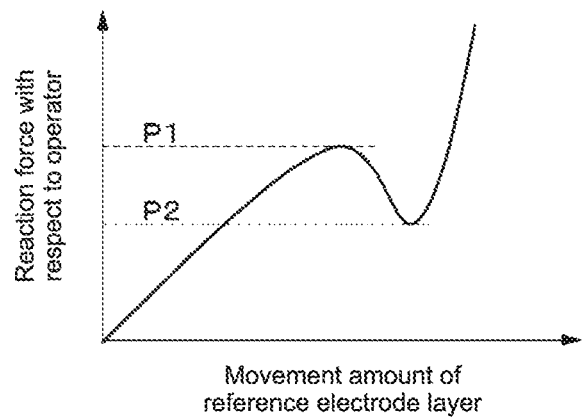
FIG. 26C is a graph showing an example of a relationship between a movement amount of a reference electrode and a reaction force with respect to the operator at a time when a peripheral portion of the key is pressed to perform the key input operation.
Figure 27B:
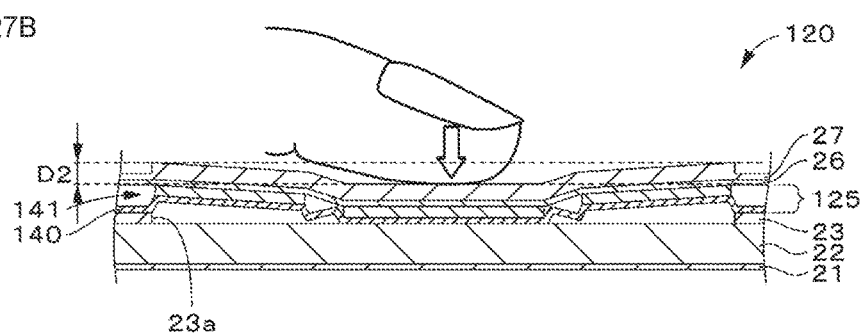
FIG. 27B is a cross-sectional view for explaining an example of an operation of the sensor module at a time when the center of the key is pressed to perform the key input operation.

As shown in FIG. 26A, when the center position $p_a$ of the key 27a (that is, key operation area Rp) of the sensor module is pressed to perform the key input operation, as shown in FIG. 27B, the structure 141 disposed on the center of the key operation area Rp is inverted, and is shifted from the initial position by the distance D2. As a result, the distance between the sensor layer 22 and the reference electrode layer 26 is largely changed by the distance D2, and the capacitance between the unit electrode bodies 52m and 53m is largely changed. By the detection units 22s in the sensor layer 22, the electrostatic capacitance change is detected and output to the controller IC 14 as the electrical signal. In the key input operation as described above, a reaction force curve characteristic with respect to the operator is obtained as shown in FIG. 27B.

Figure 27C:
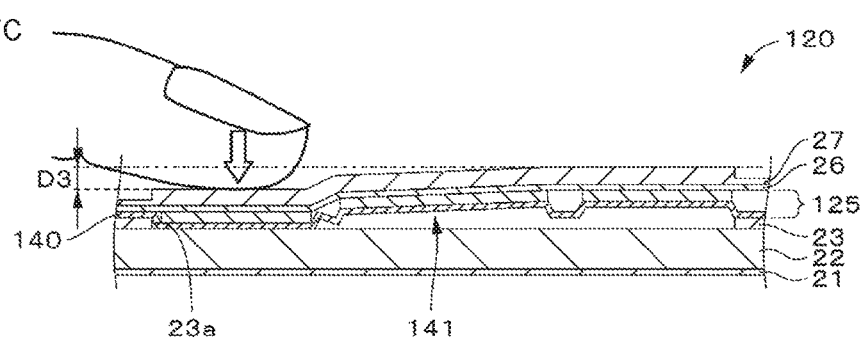
FIG. 27C is a cross-sectional view for explaining an example of an operation of the sensor module at a time when the peripheral portion of the key is pressed to perform the key input operation.

As shown in FIG. 26A, when the peripheral position $p_b$ of the key 27a (that is, key operation area Rp) of the sensor module is pressed, as shown in FIG. 27C, the structure 141 arranged on the periphery of the key operation area Rp is inverted, and is shifted from the initial position by the distance D3. As a result, the distance between the sensor layer 22 and the reference electrode layer 26 is largely changed by the distance D3, and the capacitance between the unit electrode bodies 52m and 53m is largely changed. By the detection units 22s in the sensor layer 22, the electrostatic capacitance change is detected and output to the controller IC 14 as the electrical signal. In the key input operation as described above, a reaction force curve characteristic with respect to the operator is obtained as shown in FIG. 27C. In this example, for ease of explanation, the structure 141 disposed on the center of the key operation area Rp and the structures 141 arranged on the periphery of the key operation area Rp are set to have a substantially similar reaction force curve characteristic, but may have different reaction force curve characteristics.

As described above, in accordance with a position on which the input operation is performed, the structure 141 disposed on the center of the key operation area Rp and the structures 141 arranged on the periphery of the key operation area Rp contribute to the generation of the sense of click, with the result that a click generation area can be increased.

[2.4 Effect]

In the sensor module 120 according to the second embodiment, the single-layer structure layer 125 including the plurality of structures 141 is provided between the intermediate layer 23 and the reference electrode layer 26, and the two or more structures 141 are arranged on the key operation area Rp corresponding to the key 27a. As a result, it is possible to obtain an effect similar to the first embodiment.

[2.5 Modified Example]

Figure 28A:
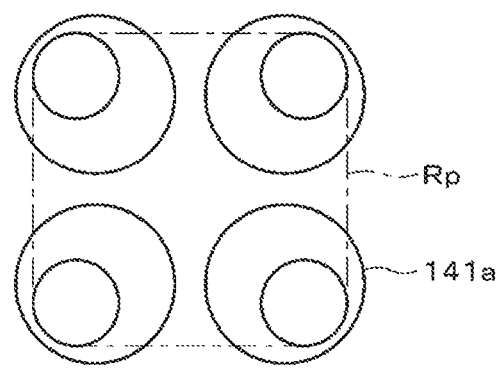
FIG. 28A is a cross-sectional view showing an example of the configuration of the sensor module according to a modified example of the second embodiment of the present technology.
Figure 28B:
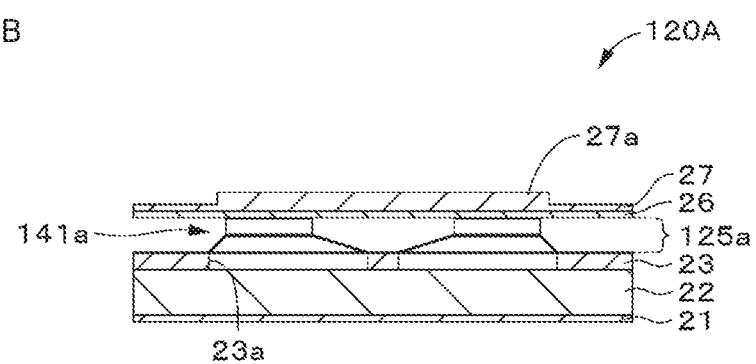
FIG. 28B is a cross-sectional view showing an example of the configuration of the sensor module according to the modified example of the second embodiment of the present technology.

As shown in FIG. 28A and FIG. 28B, a sensor module 120A according to a modified example is different from the sensor module 120 (see FIG. 21A) according to the second embodiment in that a structure layer 125a including eccentric structures 141a. A plurality of structures 141a is arranged on the peripheral portion of the key operation area Rp, for example, at the respective corners of the key operation area Rp. It should be noted that in the modified example, parts similar to those in the second embodiment are denoted by the same symbols, and a description thereof will be omitted.

When the structure 141a is disposed on the center of the key operation area Rp, it is thought that an operation load is increased. By using the eccentric structures 141a, it is possible to change the operation load depending on orientations of eccentricity of the structures 141a. Thus, by using the eccentric structures 141a, it is possible to match the operation load of the center of the key operation area Rp and the operation load of the peripheral portion thereof. The structures 141a are eccentrically disposed toward outside of the key operation area Rp, for example. In the case where the structures 141a is arranged at the corners of the key operation area Rp, the structures 141a are eccentrically disposed toward the corners of the key operation area Rp, for example.

Figure 29A:
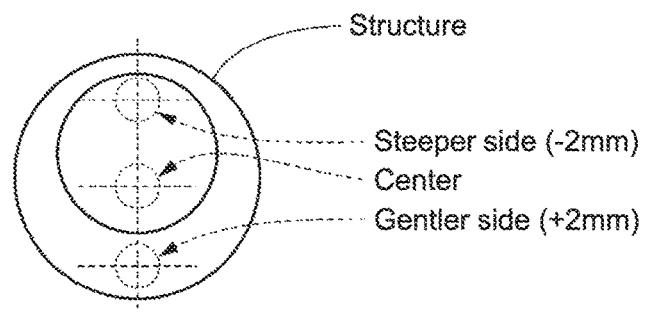
FIG. 29A is a schematic diagram showing a pressed position for a structure.
Figure 29B:
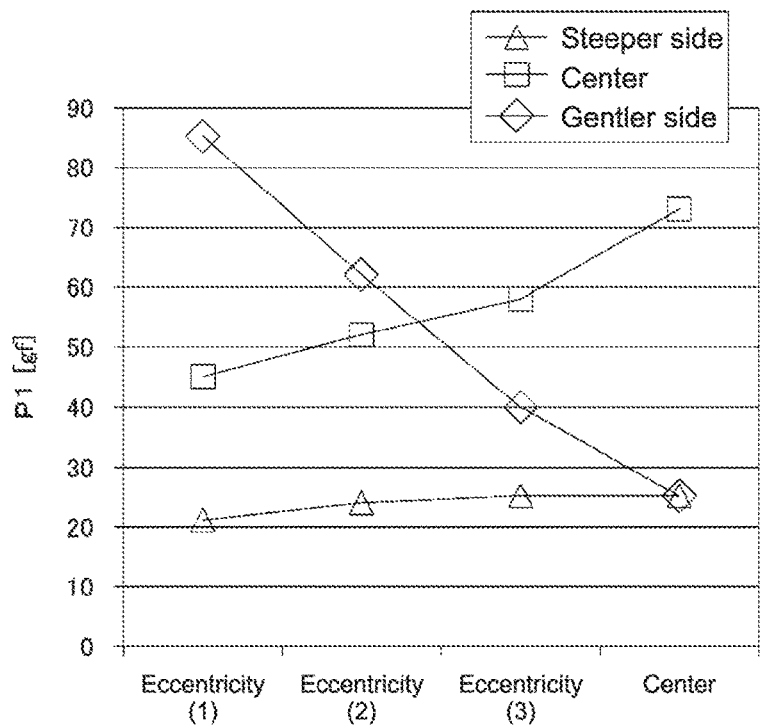
FIG. 29B is a graph showing a difference in a maximum value P1 of a reaction force with respect to pressing by an operator between an eccentric structure conical frustum shaped structure and a non-eccentric conical frustum shaped structure.
Figure 29B:

FIG. 29B shows a difference in the maximum value P1 of the reaction force with respect to pressing by the operator to an eccentric conical frustum shaped structure and a non-eccentric conical frustum shaped structure. The figure shows three eccentric conical frustum shaped structures respectively having different angles of eccentricity (eccentricities (1) to (3)). The eccentricity is decreased in order of the eccentricities (1), (2), and (3). The non-eccentric structures have a uniform slope angle of buckling portions at 7.5 degrees. For the structure having the largest eccentricity, a gentler slope angle of the buckling portion is set to 5 degrees.

FIG. 29A shows pressing positions of each data shown in FIG. 29B. From FIG. 29B, it can be recognized that the maximum value P1 of the reaction force with respect to pressing by an operation to the structure is changed depending on existence or nonexistence of eccentricity of the structure and the degree of eccentricity of the structure.

3. Third Embodiment

[3.1 Configuration of Uneven Film]

Figure 35A:
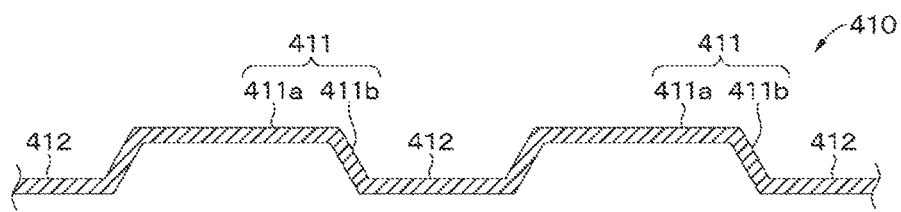
FIG. 35A is a cross-sectional view showing a configuration example of an uneven film according to a third embodiment of the present technology.

As shown in FIG. 35A, an uneven film 410 according to a third embodiment of the present technology is a so-called embossed film, and is provided with a bottom surface portion 412 and a plurality of pressing portions 411 that is provided so as to be protruded with respect to the bottom surface portion 412.

The uneven film 410 according to the third embodiment of the present technology is an uneven film disposed on the capacitance-type sensor layer 22, and can be applied to any of the sensor modules 20, 20A to 20G, 120, and 120A according to the first and second embodiment and the modified examples thereof. The uneven film 410 can be used as either of the first and second embossed layers 30 and 40 according to the first and second embodiments and the modified examples thereof. In the case where the uneven film 410 is applied to the sensor modules 20, 20A to 20G, 120, and 120A, generally, the bottom surface portion 412 is bonded to the capacitance-type sensor layer 22, the intermediate layer 23 disposed on the sensor layer 22, the first embossed layer 30, or the like. Further, on the pressing portions 411, the second embossed layer 40 or the key top layer 27 is provided. It should be noted that the bottom surface portion 412 may not be bonded to the capacitance-type sensor layer 22, the intermediate layer 23 disposed on the sensor layer 22, the first embossed layer 30, or the like, but may only be placed thereon.

The pressing portions 411 as protruded portions are configured so as to be capable of being inverted into a depressed shape by pressing top portions of the pressing portions 411. The pressing portions 411 each are a reaction force structure, the reaction force of which is nonlinearly changed with respect to a pressing amount (that is, operation load).

The plurality of pressing portions 411 is provided on a front surface side of both main surfaces of the uneven film 410. The plurality of pressing portions 411 is one-dimensionally or two-dimensionally arranged in the plane of the uneven film 410. The pressing portion 411 is a structure configured by a protruded portion of the uneven film 410. A back surface side of the pressing portion 411 is a depressed portion that is depressed so as to be modeled on the pressing portion 411 as the protruded portion. Accordingly, the inside of the pressing portion 411 is a hollow space, a bottom surface of which is opened.

It is desirable that the shape of the pressing portion 411 be a frustum shape. Having such a shape makes it possible to reduce the height of the pressing portion 411 as compared to the case of having a dome shape. Here, the frustum shape refers to a shape of a remaining portion obtained by taking away a head portion of a cone along a plane parallel to a bottom surface thereof. Examples of the frustum shape include a conical frustum shape, a pyramid frustum shape, and a polygonal frustum shape such as a hexagonal frustum shape. It should be noted that the shape of the pressing portion 411 is not limited to this and may be another shape.

The pressing portion 411 is provided with a top portion 411a and a buckling portion 411b that supports the top portion 411a. A thickness of the top portion 411a may be thinner than that of the buckling portion 411b. The buckling portion 411b may be a cone shape, or may be configured by a large number of leg portions.

The bottom surface portion 412 may be a flat portion or may have unevenness as necessary.

A large number of through holes may be formed in the uneven film 410. As a material of the uneven film 410, for example, a material similar to that of the first embossed layer 30 in the first embodiment can be used.

[3.2 Effect]

In the uneven film according to the third embodiment described above, by pressing the top portion of the pressing portion 411, the pressing portion 411 can be inverted into the depressed shape. Accordingly, it is possible to a desirable sense of click with a thin thickness.

[3.3 Modified Examples]

Modified Example 1

Figure 35B:
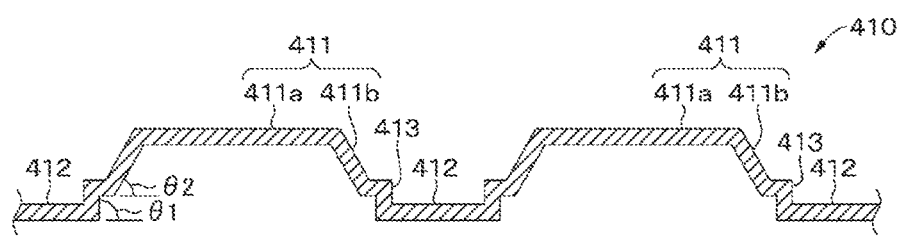
FIG. 35B is a cross-sectional view showing a configuration example of an uneven film according to a modified example 1 of the third embodiment of the present technology.

As shown in FIG. 35B, the uneven film 410 may be further provided with base portions 413 provided on bottom sides of the pressing portions 411. In the case of using this configuration, the sense of click can be improved.

The pressing portion 411 and the base portion 413 are configured by the protruded portion of the uneven film 410. A side surface of the base portion 413 is erected substantially vertically to the bottom surface portion 412 or is tilted with respect to the bottom surface portion 412 at a tilt angle of less than 90 degrees. It is desirable that an outer circumference of the bottom portion of the pressing portion 411 be in internal contact or substantially internal contact with an outer circumference of the top portion of the base portion 413. This is because this configuration further improves the sense of click. Specifically, for example, in the case where the pressing portion 411 has a conical frustum shape or a polygonal frustum shape, and the base portion 413 has a cube shape, it is desirable that the outer circumference of a circular shape or a polygonal shape of the bottom portion of the pressing portion 411 be in internal contact or substantially internal contact with an outer circumference of a square shape of the top portion of the base portion 413. From the viewpoint of the improvement of the sense of click, it is desirable that a tilt angle θ1 of the side surface of the base portion 413 be more than a tilt angle θ2 of the buckling portion 411*b*. Here, the tilt angles θ1 and θ2 are tilt angles measured with the back surface of the bottom surface portion 412 or the front surface of the sensor layer as a reference (0°).

Modified Example 2

Figure 35C:
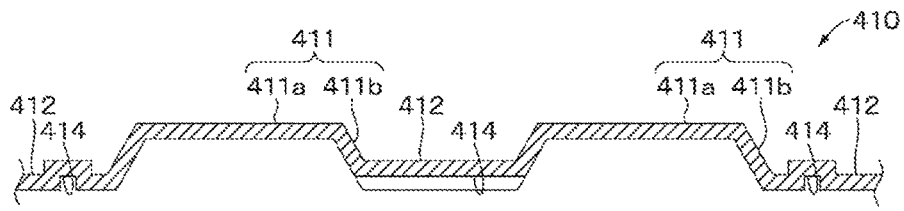
FIG. 35C is a cross-sectional view showing a configuration example of an uneven film according to a modified example 2 of the third embodiment of the present technology.

As shown in FIG. 35C, on the back surface of the uneven film 410, a depressed portion 414 provided in an extended manner so as to link the adjacent pressing portions 411 and link the periphery of the uneven film 410 and the pressing portions 411 may be provided.

When the uneven film 410 is applied to the sensor module, in the case where the uneven film 410 is bonded to the sensor layer or the intermediate layer or the like disposed on the sensor layer, the depressed portion 414 and the front surface of the sensor layer, the intermediate layer, or the like configure a hole portion. The hole portion functions as a vent for discharging air in inside space of the pressing portion 411 to outside when the pressing portion 411 is pressed.

It should be noted that in the case where the depressed portion 414 is formed on the uneven film 410 according to the modified example 1, it is only necessary to provide the depressed portion 414 that is extended so as to link the adjacent base portions 413 and link the periphery of the uneven film 410 and the base portion 413.

Modified Example 3

Figure 36A:
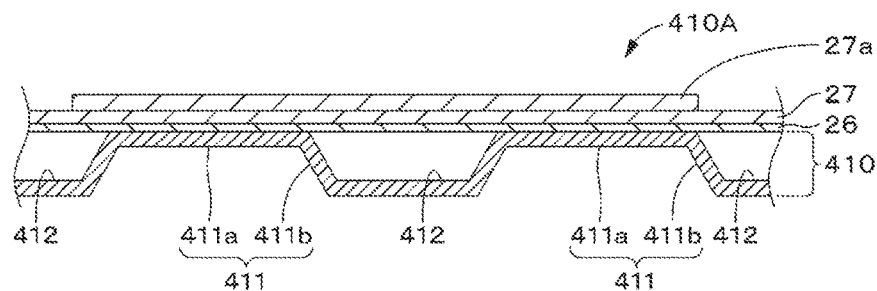
FIG. 36A is a cross-sectional view showing a configuration example of an uneven film according to a modified example 3 of the third embodiment of the present technology.

As shown in FIG. 36A, on the plurality of pressing portions 411, the key top layer 27 may be provided. In this case, the uneven film 410 and the key top layer 27 constitute an uneven structure 410A. The uneven structure 410A may be further provided with the reference electrode layer 26 between the plurality of pressing portions 411 and the key top layer 27.

Modified Example 4

Figure 36B:
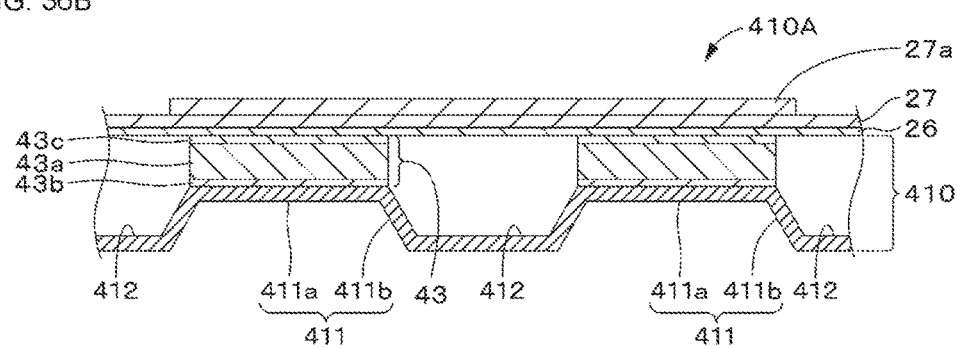
FIG. 36B is a cross-sectional view showing a configuration example of an uneven film according to a modified example 4 of the third embodiment of the present technology.

As shown in FIG. 36B, the uneven film 410 may be further provided with the plurality of pressure bodies 43 disposed on the plurality of pressing portions 411, respectively. Further, on the plurality of pressure bodies 43, the key top layer 27 may be provided. In this case, the uneven film 410, the plurality of pressure bodies 43, and the key top layer 27 constitute the uneven structure 410A. The uneven structure 410A may be further provided with the reference electrode layer 26 between the plurality of pressure bodies 43 and the key top layer 27.

Modified Example 5

Figure 36C:
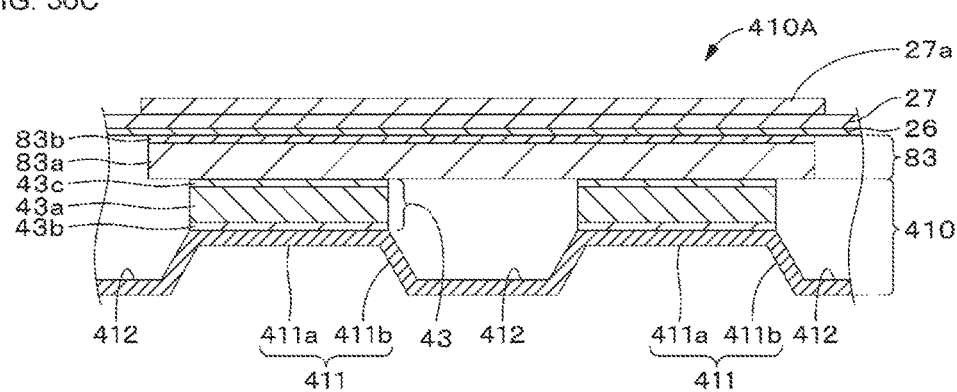
FIG. 36C is a cross-sectional view showing a configuration example of an uneven film according to a modified example 5 of the third embodiment of the present technology.

As shown in FIG. 36C, a plurality of support layers 71 may be further provided between the plurality of pressure bodies 43 and the key top layer 27, respectively. In the case where this configuration is used, it is possible to suppress a gritty feel of the pressing portions 411 through the key top layer 27 when the front surface of the key top layer 27 is touched with a finger or the like. FIG. 36C shows the example in which, on the pressing portions 411, the pressure bodies 43, the support layers 71, the reference electrode layer 26, and the key top layer 27 are provided. At least one kind of the pressure bodies 43, the reference electrode layer 26, and the key top layer 27 may not be provided. For example, only the support layers 71 may be provided on the pressing portions 411.

4. Fourth Embodiment

[4.1 Configuration of Uneven Structure]

Figure 37A:
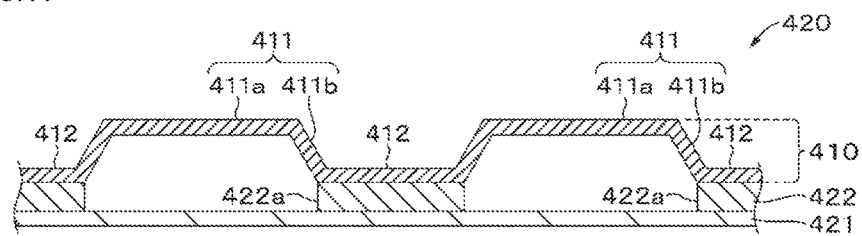
FIG. 37A is a cross-sectional view showing a configuration example of an uneven structure according to a fourth embodiment of the present technology.

As shown in FIG. 37A, an uneven structure 420 according to a fourth embodiment of the present technology is provided with a base layer 421, an adhesive layer 422, and the uneven film 410 fixed onto the base layer 421 through the adhesive layer 422. It should be noted that, in the fourth embodiment, parts similar to those in the third embodiment are denoted by the same symbols, and a description thereof will be omitted.

The uneven structure 420 according to the fourth embodiment of the present technology is disposed on the capacitance-type sensor layer 22, and can be applied to any of the sensor modules 20, 20A to 20G, 120, 120A according to the first and second embodiments and the modified examples thereof described above. Further, the uneven structure 420 can be used as the first embossed layer 30 or a laminated body of the intermediate layer 23 and the first embossed layer 30 in the first and second embodiments and the modified examples thereof. In the case where the uneven structure 420 is applied to the sensor modules 20, 20A to 20G, 120, and 120A, normally, the base layer 421 is placed on the capacitance-type sensor layer 22 or the intermediate layer 23 disposed on the sensor layer 22. Further, on the pressing portions 411, the second embossed layer 40 is provided.

The base layer 421 and the uneven film 410 have the same or substantially the same linear expansion coefficient. The base layer 421 and the uneven film 410 may be made of the same material, or may be made of different materials having the same or substantially the same linear expansion coefficient. It is desirable that the base layer 421 be a film. As a material of the base layer 421, for example, it is possible to use a material similar to that of the first embossed layer 30 in the first embodiment.

The adhesive layer 422 is provided between the bottom surface portion 412 of the uneven film and the base layer 421. The adhesive layer 422 has plurality of hole portions 422*a* that is formed on positions corresponding to a plurality of pressing portions 411, respectively. The hole portions 422*a* are through holes that penetrate the adhesive layer 422 from a front surface to a back surface thereof. When viewed in a direction vertical to the front surface of the uneven structure 420, the plurality of hole portions 422*a* is formed on positions superposed on the plurality of pressing portions 411. The pressing portions 411 is capable of being pressed into the hole portions 422*a*.

[4.2 Modified Examples]

Modified Example 1

Figure 37B:
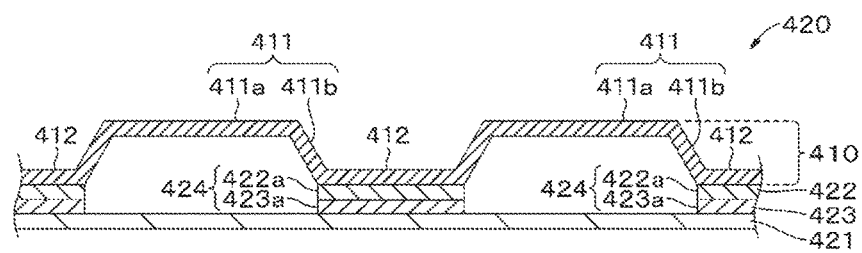
FIG. 37B is a cross-sectional view showing a configuration example of an uneven structure according to a modified example 1 of the fourth embodiment of the present technology.

As shown in FIG. 37B, a resin layer 423 disposed between the base layer 421 and the adhesive layer 422 may be further provided. The resin layer 423 is a film or a coating layer, for example. It is desirable that the resin layer 423 have a plurality of hole portions 423*a* formed on positions corresponding to the plurality of pressing portions 411, respectively. The hole portions 423*a* are through holes that penetrate the resin layer 423 from the front surface to the back surface thereof. The plurality of hole portions 423*a* is formed on positions superposed on the plurality of hole portions 422*a*, respectively. The hole portions 422*a* and 423*a* constitute one hoe portion 424. The pressing portion 411 is configured so as to be capable of being pressed into the hole portion 424.

Modified Example 2

Figure 37C:
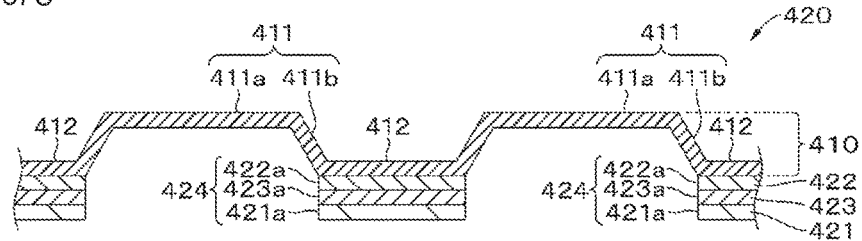
FIG. 37C is a cross-sectional view showing a configuration example of an uneven structure according to a modified example 2 of the fourth embodiment of the present technology.

As shown in FIG. 37C, the base layer 421 may have a plurality of hole portions 421*a* formed on positions corresponding to the plurality of pressing portions 411, respectively. The hole portions 421*a* are through holes that penetrate the base layer 421 from the front surface to the back surface thereof. The plurality of hole portions 421*a* are formed on positions superposed on the plurality of hole portions 422*a* and 423*a*, respectively. The hole portions 421*a*, 422*a*, and 423*a* constitute one hole portion 424. The pressing portion 411 may be configured so as to be capable of being pressed into the hole portion 424.

Modified Example 3

In the uneven structure 420 according to the fourth embodiment, the base layer 421 may have the plurality of hole portions 421*a* in the modified example 2 described above. In this case, the hole portions 421*a* and 422*a* constitute the one hole portion 424.

Modified Example 4

The base layer 421 and the uneven film 410 may be fixed to each other with an energy line curable resin composition such as an ultraviolet curable resin composition, an adhesive tape, or the like, and may be fixed by heat welding instead of the adhesive layer 422.

Modified Example 5

In the uneven structure 420 according to the fourth embodiment and the modified examples 1 to 4 thereof, a configuration similar to that in the modified examples 1 to 4 of the third embodiment may be used.

The embodiments of the present technology, the modified examples and examples thereof are specifically described above. The present technology is not limited to the above embodiments and the modified examples and examples thereof, and can be variously modified on the basis of the technical idea of the present technology.

For example, the configurations, methods, processes, shapes, materials, numerals, and the like given in the above embodiments and the modified examples and examples thereof merely examples, and when necessary, different configurations, methods, processes, shapes, materials, numerals, and the like may be used.

Further, the configurations, methods, processes, shapes, materials, numerals, and the like given in the above embodiments and the modified examples and examples thereof can be combined with each other without departing from the gist of the present technology.

Further, in the above embodiments, the case where the input apparatus is the keyboard provided with the plurality of keys is described as an example. The input apparatus may be a switch, a button, or the like provided with one key.

Furthermore, in the above embodiments and the modified examples thereof, it is unnecessary to bond the intermediate layer and the sensor layer to each other. Further, a member such as a backlight may be provided between the intermediate layer and the sensor layer.

Further, the present technology can have the following configuration.

(1)

An input apparatus, including:

a conductive layer having flexibility;

a capacitance-type sensor layer including a plurality of detection units; and a structure layer including a plurality of structures, a reaction force of which is non-linearly changed with respect to a pressing amount, the structure layer being disposed between the conductive layer and the sensor layer, in which the two or more structures are disposed in an operation area corresponding to the detection units.

(2)

The input apparatus according to (1), in which the structure layer includes two or more laminated structures, and the two or more structures are disposed to be separated in the two or more layers.

(3)

The input apparatus according to (1), in which the structure layer includes two or more laminated structures, and the two or more structures are disposed in such a manner that at least one structure is included in the operation area of each layer of the structure layer.

(4)

The input apparatus according to (2) or (3), in which the structure is disposed on a center of the operation area in a first layer of the two or more laminated structures, and the structure is disposed on a periphery of the operation area in a second layer of the two or more laminated structures.

(5)

The input apparatus according to (4), in which the first layer is disposed on the sensor side, the second layer is disposed on the conductive layer side, and the second layer has a pressure column on the center of the operation area.

(6)

The input apparatus according to any one of (1) to (3), in which the two or more structures include a first structure having a depressed portion on a surface on the sensor layer side and a second structure disposed in the depressed portion, and an outer circumferential portion of the second structure is positioned on a periphery of the operation area.

(7)

The input apparatus according to any one of (1) to (3), in which the two or more structures include a first structure that is protruded toward the conductive layer and a second structure that is protruded toward the sensor, and the first structure and the second structure each have top portions that face each other.

(8)

The input apparatus according to (1), in which the structure layer has a single-layer structure, and the two or more structures are disposed in an in-plane direction of the sensor layer.

(9)

The input apparatus according to (8), in which the two or more structures are disposed on a periphery of the operation area eccentrically.

(10)

The input apparatus according to any one of (1) to (9), in which the structure layer includes an uneven layer having a plurality of protruded portions, and the structure is configured by the protruded portion.

(11)

The input apparatus according to any one of (1) to (9), in which the structure layer includes an uneven layer having a plurality of protruded portions, and a plurality of pressure bodies disposed on top portions of the plurality of protruded portion, respectively, and the structure is configured by the protruded portion and the pressure body.

(12)

The input apparatus according to (10) or (11), in which the uneven layer is an embossed film.

(13)

The input apparatus according to any one of (1) to (12), further including:

an intermediate layer disposed between the structure layer and the sensor layer, in which the intermediate layer has a plurality of hole portions formed on positions corresponding to the plurality of detection units, respectively.

(14)

An input apparatus, including:

a capacitance-type sensor layer having a plurality of detection units; and a structure layer having a plurality of structures, a reaction force of which is non-linearly changed with respect to a pressing amount, the structure layer being disposed on the sensor layer, in which the structure layer has flexibility and conductivity, and the two or more structures are disposed in an operation area corresponding to the detection units.

(15)

The input apparatus according to (14), in which the structure layer includes an uneven layer and a conductive layer.

(16)

The input apparatus according to (14), in which the structure layer includes an uneven layer containing a conductive material.

(17)

A keyboard including the input apparatus according to any one of (1) to (16).

(18)

An electronic apparatus including the input apparatus according to any one of (1) to (16).

(19)

The input apparatus according to (13), in which the structure includes a base portion having a side surface disposed to be elected substantially vertically to a front surface of the intermediate layer or disposed to be tilted with respect thereto, and a protruded portion disposed on the base portion.

(20)

The input apparatus according to (13) or (19), further including:

a base layer disposed between the sensor layer and the intermediate layer, in which the plurality of structures is configured by an embossed layer, and the base layer has the same or substantially the same linear expansion coefficient as the embossed layer.

(21)

The input apparatus according to (20), in which the base layer has a plurality of hole portions into which the plurality of structures is pressed, respectively.

(22)

The input apparatus according to any one of (1) to (16) and (19), in which the sensor layer includes a base material, the plurality of structures is configured by an embossed layer, and the base material has the same or substantially the same linear expansion coefficient as the embossed layer.

(23)

The input apparatus according to any one of (1) to (16) and (19) to (22), in which the structure includes a protruded portion, a first pressure body disposed on a top portion of the protruded portion, and a second pressure body disposed on the first pressure body.

(24)

The input apparatus according to (23), in which the first pressure body is configured in accordance with a shape given to the top portion of the protruded portion, and the second pressure body is configured by the adhesive film.

(25)

The input apparatus according to any one of (1) to (24), further including:

a key top layer including a plurality of keys; and a plurality of support layer disposed between the plurality of structures and the key top layer, respectively.

(26)

A keyboard including the input apparatus according to any one of (19) to (25).

(27)

An electronic apparatus including the input apparatus according to any one of (19) to (25).

(28)

A sensor, including:

a conductive layer having flexibility;

a capacitance-type sensor layer including a plurality of detection units; and a structure layer including a plurality of structures, a reaction force of which is non-linearly changed with respect to a pressing amount, the structure layer being disposed between the conductive layer and the sensor layer, in which the two or more structures are disposed in an operation area corresponding to the detection units.

(29)

An uneven film disposed on a capacitance-type sensor layer, including:

a plurality of pressing portions, a reaction force of which is non-linearly changed with respect to a pressing amount, in which the pressing portions are configured by protruded portions of unevenness.

(30)

The uneven film according to (29), in which the pressing portion further includes a base portion disposed on a bottom side of the pressing portion, and the pressing portion and the base portion are configured by protruded portions of unevenness.

(31)

The uneven film according to (30), in which the pressing portion has a frustum shape, and the base portion has a rectangular parallelepiped shape.

(32)

The uneven film according to (30) or (31), in which
an outer circumference of a bottom portion of the pressing portion is in internal contact or substantially internal contact with an outer circumference of a top portion of the base portion.

(33)

The uneven film according to any one of (30) to (32), in which
a tilt angle of a side surface of the base portion is larger than a tilt angle of a buckling portion of the pressing portion.

(34)

The uneven film according to any one of (29) to (33), further including:
a pressure body disposed on the pressing portion.

(35)

The uneven film according to any one of (29) to (34), further including:
a key top layer disposed on the plurality of pressing portions.

(36)

The uneven film according to (35), further including:
a plurality of support layer disposed between the plurality of pressing portions and the key top layer, respectively.

(37)

An uneven structure disposed on a capacitance-type sensor layer, including:
a base layer;
an uneven film fixed onto the base layer; and
a plurality of pressing portions, a reaction force of which is non-linearly changed with respect to a pressing amount, in which
the pressing portions are configured by protruded portions of unevenness.

(38)

The uneven structure according to (37), in which
the base layer and the uneven film have the same or substantially the same linear expansion coefficient.

(39)

The uneven structure according to (37) or (38), further including:
an adhesive layer disposed between the base layer and the uneven film.

(40)

The uneven structure according to (39), in which
the adhesive layer has a plurality of hole portions formed on positions corresponding to the plurality of pressing portions, respectively.

(41)

The uneven structure according to (39), further including:
a resin layer disposed between the base layer and the adhesive layer.

(42)

The uneven structure according to (41), in which the adhesive layer and the resin layer have a plurality of hole portions formed on positions corresponding to the plurality of pressing portions, respectively.

(43)

The uneven structure according to (41), in which
the base layer, the adhesive layer, and the resin layer have a plurality of hole portions formed on positions corresponding to the plurality of pressing portions, respectively.

(44)

The uneven structure according to (40), (42), or (43), in which
the pressing portions are configured to be capable of being pressed into the hole portions.

(45)

The uneven structure according to any one of (37) to (44), in which
the pressing portion further includes a base portion disposed on a bottom side of the pressing portion, and
the pressing portion and the base portion are configured by protruded portions of unevenness.

(46)

The uneven structure according to (45), in which
the pressing portion has a frustum shape, and
the base portion has a rectangular parallelepiped shape.

(47)

The uneven structure according to (45) or (46), in which
an outer circumference of a bottom portion of the pressing portion in internal contact or substantially internal contact with an outer circumference of a top portion of the base portion.

(48)

The uneven structure according to any one of (45) or (47), in which
a tilt angle of the base portion is larger than a tilt angle of the pressing portion.

(49)

The uneven structure according to any one of (37) or (48), further including:
a pressure body disposed on the pressing portion.

(50)

The uneven structure according to any one of (37) or (49), further including:
a key top layer disposed on the plurality of pressing portions.

(51)

The uneven structure according to (50), further including:
a plurality of support layers disposed between the plurality of pressing portions and the key top layer, respectively.

REFERENCE SIGNS LIST 10 electronic apparatus
11 input apparatus
12 host
13 display apparatus
14 controller IC
20 sensor module
21, 26 reference electrode layer
22 sensor layer
23 intermediate layer
24 first structure layer
25 second structure layer
27 key top layer
30 first embossed layer
31 first structure
40 second embossed layer
41 second structure
42 protruded portion
43 pressure body
31a, 42a top portion
31b, 42b buckling portion
51 base material
52 X electrode
53 Y electrode
54 insulation layer

The invention claimed is:
1. An input apparatus, comprising:
a conductive layer, wherein the conductive layer has flexibility;

a capacitance-type sensor layer comprising a plurality of detection units; and at least one structure layer comprising a plurality of structures, wherein a reaction force of the plurality of structures is non-linearly changed with respect to a pressing amount on the plurality of structures, wherein the at least one structure layer is between the conductive layer and the capacitance-type sensor layer, wherein a set of structures of the plurality of structures are on a periphery of an operation area eccentrically, and wherein the operation area corresponds to the plurality of detection units.

2. The input apparatus according to claim 1, wherein the at least one structure layer comprises at least two laminated structure layers, and the set of structures are separated in the at least two laminated structure layers.

3. The input apparatus according to claim 2, wherein at least a first structure of the set of structures is on a center of the operation area in a first layer of the at least two laminated structure layers, and at least a second structure of the set of structures is on the periphery of the operation area in a second layer of the at least two laminated structure layers.

4. The input apparatus according to claim 3, wherein the first layer is on a capacitance-type sensor layer side, the second layer is on a conductive layer side, and the second layer comprises a pressure column on a center of the operation area in the second layer.

5. The input apparatus according to claim 1, wherein the at least one structure layer comprises at least two laminated structure layers, and the set of structures of the plurality of structures are on the at least two laminated structure layers, each of the at least two laminated structure layers comprises at least one structure of the set of structures in the operation area of each of the at least two laminated structure layers.

6. The input apparatus according to claim 1, wherein the plurality of structures comprise a first structure and a second structure, the first structure comprises a depressed portion on a surface on a capacitance-type sensor layer side, the second structure is in the depressed portion, and an outer circumferential portion of the second structure is on the periphery of the operation area.

7. The input apparatus according to claim 1, wherein the plurality of structures comprise a first structure and a second structure, the first structure is protruded toward the conductive layer and the second structure is protruded toward the capacitance-type sensor layer, and a top portion of the first structure faces a top portion of the second structure.

8. The input apparatus according to claim 1, wherein the at least one structure layer has a single-layer structure, and the plurality of structures are in an in-plane direction of the capacitance-type sensor layer.

9. The input apparatus according to claim 1, wherein the at least one structure layer is an uneven layer;

the uneven layer comprises a plurality of protruded portions, and at least one structure of the plurality of structures comprises at least one protruded portion of the plurality of protruded portions.

10. The input apparatus according to claim 9, wherein the uneven layer is an embossed film.

11. The input apparatus according to claim 1, wherein the at least one structure layer is an uneven layer, the uneven layer comprises a plurality of pressure bodies and a plurality of protruded portions, the plurality of pressure bodies are on top portions of the plurality of protruded portions, and at least one structure of the plurality of structures comprises at least one protruded portion of the plurality of protruded portions and at least one pressure body of the plurality of pressure bodies.

12. The input apparatus according to claim 1, further comprising an intermediate layer between the at least one structure layer and the capacitance-type sensor layer, wherein the intermediate layer comprises a plurality of hole portions, and wherein positions of the plurality of hole portions on the intermediate layer correspond to the plurality of detection units.

13. An input apparatus, comprising:

a capacitance-type sensor layer comprising a plurality of detection units; and at least one structure layer comprising a plurality of structures, wherein a reaction force of the plurality of structures is non-linearly changed with respect to a pressing amount on the plurality of structures, wherein the at least one structure layer is on the capacitance-type sensor layer, wherein the at least one structure layer has flexibility and conductivity, a set of structures of the plurality of structures are on a periphery of an operation area eccentrically, and the operation area corresponds to the plurality of detection units.

14. The input apparatus according to claim 13, wherein the at least one structure layer comprises an uneven layer and a conductive layer.

15. The input apparatus according to claim 13, wherein the at least one structure layer is an uneven layer, and wherein the uneven layer comprises a conductive material.

16. A keyboard, comprising:

a conductive layer, wherein the conductive layer has flexibility;

a capacitance-type sensor layer comprising a plurality of detection units; and at least one structure layer comprising a plurality of structures, wherein a reaction force of the plurality of structures is non-linearly changed with respect to a pressing amount on the plurality of structures, wherein the at least one structure layer is between the conductive layer and the capacitance-type sensor layer, wherein a set of structures of the plurality of structures are on a periphery of an operation area eccentrically, and the operation area corresponds to the plurality of detection units.

17. An electronic apparatus, comprising:

a conductive layer, wherein the conductive layer has flexibility;

a capacitance-type sensor layer comprising a plurality of detection units; and at least one structure layer comprising a plurality of structures, wherein a reaction force of the plurality of structures is non-linearly changed with respect to a pressing amount on the plurality of structures, wherein the at least one structure layer is between the conductive layer and the capacitance-type sensor layer, wherein a set of structures of the plurality of structures are on a periphery of an operation area eccentrically, and the operation area corresponds to the plurality of detection units.

\* \* \* \* \*